US012203776B2

(12) United States Patent
Koduri et al.

(10) Patent No.: US 12,203,776 B2
(45) Date of Patent: Jan. 21, 2025

(54) MINIATURE SENSOR CAVITIES

(71) Applicant: TEXAS INSTRUMENTS INCORPORATED, Dallas, TX (US)

(72) Inventors: Sreenivasan Kalyani Koduri, Allen, TX (US); Christopher Daniel Manack, Flower Mound, TX (US); Leslie Edward Stark, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 672 days.

(21) Appl. No.: 16/950,981

(22) Filed: Nov. 18, 2020

(65) Prior Publication Data

US 2022/0155109 A1 May 19, 2022

(51) Int. Cl.

*G01D 11/24* (2006.01)
*H01L 21/48* (2006.01)
*H01L 21/56* (2006.01)
*H01L 23/31* (2006.01)
*H01L 23/495* (2006.01)

(52) U.S. Cl.

CPC ........ *G01D 11/245* (2013.01); *H01L 21/4825* (2013.01); *H01L 21/565* (2013.01); *H01L 23/3114* (2013.01); *H01L 23/49503* (2013.01); *H01L 23/4952* (2013.01)

(58) Field of Classification Search

CPC . G01D 11/245; H01L 21/4825; H01L 21/565; H01L 23/3114; H01L 23/49503; H01L 23/4952

See application file for complete search history.

(56) References Cited

U.S. PATENT DOCUMENTS

2015/0302955 A1* 10/2015 Fahimi .................... G01L 19/04 174/99 R
2017/0052277 A1* 2/2017 Wong .................... H01L 25/167
2018/0306660 A1* 10/2018 Wade .................. A61M 5/1452
2020/0027834 A1* 1/2020 Chan ...................... H05K 1/183
2020/0400520 A1* 12/2020 Huntzinger ......... G01L 19/0038

* cited by examiner

*Primary Examiner* — Marc Anthony Armand

(74) *Attorney, Agent, or Firm* — Dawn Jos; Frank D. Cimino

(57) ABSTRACT

In examples, a sensor package includes a semiconductor die, a sensor on the semiconductor die, and a ring encircling the sensor. The sensor and an inner surface of the ring are exposed to an exterior environment of the sensor package. The sensor package includes a mold compound covering the semiconductor die and abutting an outer surface of the ring.

16 Claims, 40 Drawing Sheets

102
904
902
904
800
200
202
202
600
300
900
902
902

MINIATURE SENSOR CAVITIES

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In examples, a sensor package includes a semiconductor die, a sensor on the semiconductor die, and a ring encircling the sensor. The sensor and an inner surface of the ring are exposed to an exterior environment of the sensor package. The sensor package includes a mold compound covering the semiconductor die and abutting an outer surface of the ring.

In examples, a method includes providing a semiconductor die having a sensor, positioning a ring encircling the sensor, and positioning the semiconductor die and the ring in a mold chase. A film is between the ring and a member of the mold chase. The method includes covering the semiconductor die with a mold compound, the ring precluding the mold compound from covering the sensor.

BRIEF DESCRIPTION OF THE DRAWINGS

For a detailed description of various examples, reference will now be made to the accompanying drawings in which.

DETAILED DESCRIPTION

Figure 1:
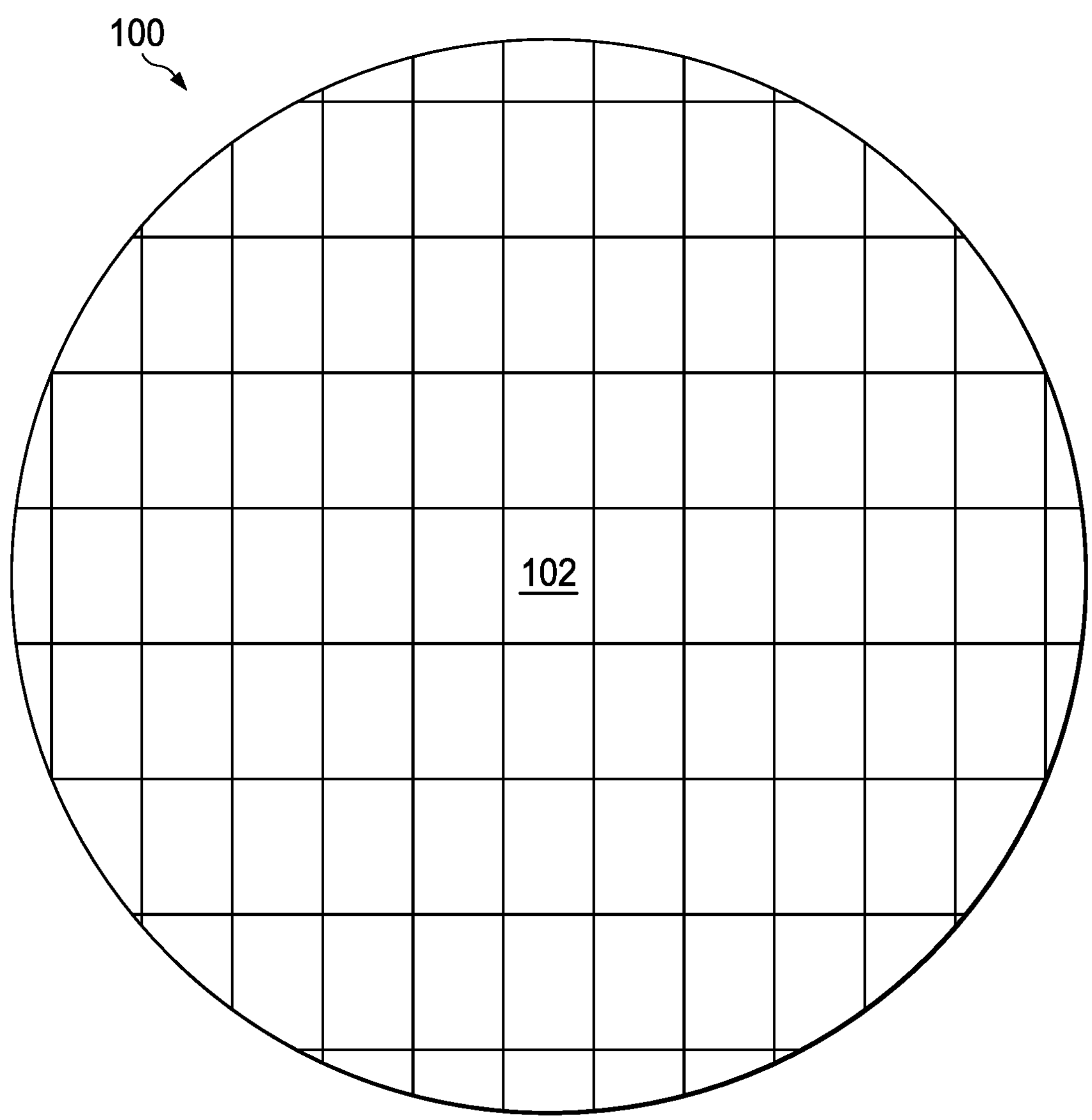
FIGS. 1-14 depict process flows for manufacturing a sensor package having a miniature sensor cavity formed by a ring circumscribing a sensor on a semiconductor die, in accordance with various examples.

Some types of packages are configured to measure various physical properties of an environment, such as temperature, humidity, light, sound, pressure, etc. In many instances, the package includes a sensor that is exposed directly to the environment to be tested. Thus, for example, a package that is configured to measure the temperature of a swimming pool may be positioned in an area of the pool where the sensor will be directly exposed to the pool water. Such packages are referred to herein as sensor packages.

Sensor packages contain sensors, but they also contain other circuitry, such as an analog front-end (AFE) circuit, to process the properties of the environment sensed by the sensor. This circuitry cannot be exposed to the environment, as doing so could damage the circuitry and render it inoperable. Accordingly, sensor packages are fabricated so that the sensor is exposed to the environment, but the remaining circuitry of the package is covered by the mold compound of the package. A sensor package may include a cavity in its mold compound, and the sensor is positioned inside this cavity.

Contemporary designs for sensor packages are unsatisfactory for multiple reasons, most of which are due to inefficiencies in the manufacturing process, and specifically due to inefficiencies in creating the sensor cavities mentioned above. For example, sensor cavities are created using complex and expensive molding equipment that is limited in its ability to create small sensor cavities. Each sensor cavity formed by this equipment should be of a minimum threshold size. This inability to create small sensor cavities limits each sensor package to a single cavity, and, thus, to a single sensor. While this challenge could theoretically be mitigated by increasing package size, such increases are highly undesirable, and most or all industries and customers demand decreasing package size instead of increasing package size. Furthermore, not only are sensor packages limited to a single sensor cavity and a single sensor, but sensor packages should be of a minimum threshold size so that even one sensor cavity can be accommodated. Thus, these sensor packages with only one sensor cannot be further decreased in size.

Further still, the complex and expensive molding equipment that is used to create the unsatisfactorily large sensor cavities is package-specific, meaning that the equipment generally cannot be re-used for multiple types of sensor packages. Instead, different equipment should be used to create sensor cavities in different types of sensor packages. Different equipment should be used even in the instance that multiple sensor cavity shapes are desired for the same type of sensor package. This repeated investment in different types of equipment introduces significant increases in design costs, manufacturing costs, development time, and manufacturing time.

This disclosure describes various examples of a sensor package and examples of techniques for manufacturing such a sensor package that overcome the challenges described above. Specifically, in contrast to other techniques for forming sensor cavities in sensor packages, some of the examples described below entail the use of components and techniques that result in miniature sensor cavities, which facilitates the reduction of sensor packages sizes and/or the incorporation of multiple sensor cavities and sensors in a single sensor package. In some examples, rings (e.g., plated metal rings) are positioned on a semiconductor die, circumscribing a semiconductor die sensor, prior to placing the semiconductor die in a mold chase to apply a mold compound. The ring prevents mold compound from flowing onto the sensor, thus creating a sensor cavity in the mold compound. Such rings may be composed of metal or non-metal materials, and they may be grown on the semiconductor die using a plating process or may be manufactured separately from the semiconductor die and coupled to the semiconductor die using an adhesive. Other examples described below entail the use of a solid member (e.g., studs) that is used to cover a semiconductor die sensor prior to placing the sensor in a mold chase. The solid member prevents mold compound from covering the sensor. The solid member is subsequently removed, thereby producing a sensor cavity in the mold compound. The solid member may be composed of metal or non-metal materials (e.g., compressible materials), and they may be grown on the semiconductor die using a plating process or may be manufactured separately from the semiconductor die and coupled to the semiconductor die using an adhesive. In some examples, the solid member may have a high coefficient of thermal expansion (CTE) so that, after the mold compound has been applied to the semiconductor die, a freezing temperature is applied to the solid member to cause the solid member to decrease in size and to facilitate removal of the solid member from the mold compound. These and other examples are now described with reference to the drawings.

FIG. 1 is a schematic diagram of a semiconductor wafer 100, in accordance with various examples. For example, the semiconductor wafer 100 may be a silicon wafer. The semiconductor wafer 100 comprises multiple semiconductor dies 102. The manufacturing techniques described below may be performed on individual semiconductor dies 102 (post-singulation), or the techniques may be more efficiently performed on a mass scale, e.g., simultaneously on multiple semiconductor dies 102 of the semiconductor wafer 100 (pre-singulation). For convenience and clarity, the remaining drawings show one semiconductor die 102, with the understanding that the processes described herein as being performed on the semiconductor die 102 may also be performed (e.g., sequentially performed, simultaneously performed) on the remaining semiconductor dies 102 of the wafer 100. In addition, although the portions of a wafer separated by scribe streets sometimes are not referred to as semiconductor dies until the wafer has been sawn (e.g., post-singulation), this disclosure nevertheless uses the term "semiconductor die(s)" to refer to dies both pre- and post-singulation. Thus, the intact wafer 100 is said to include multiple semiconductor dies 102 and, after the wafer 100 is sawn, the resulting separate portions of the wafer 100 are also referred to as semiconductor dies 102.

Figure 2A:
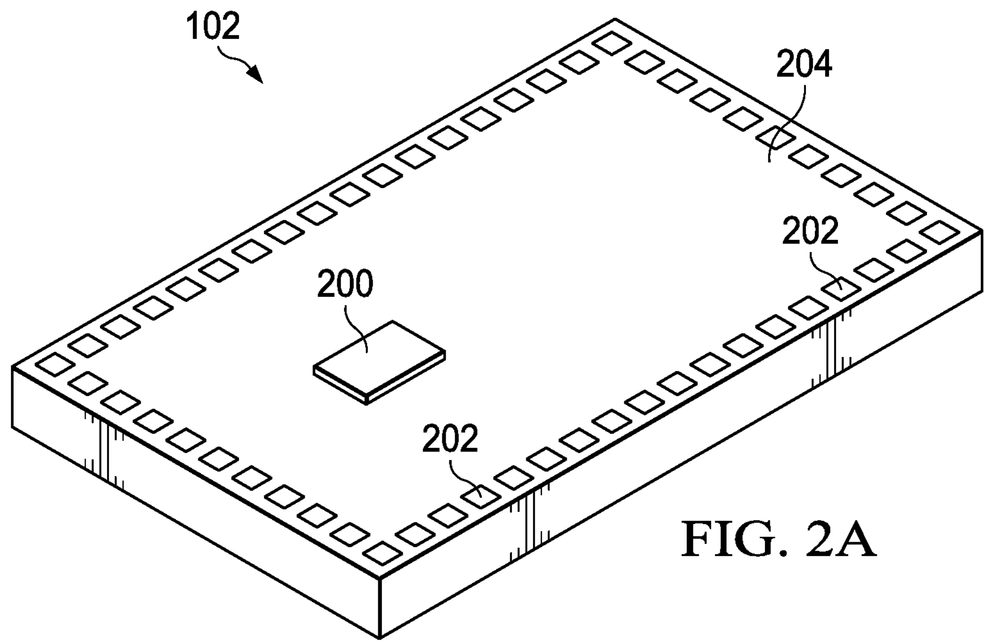
Figure 2B:
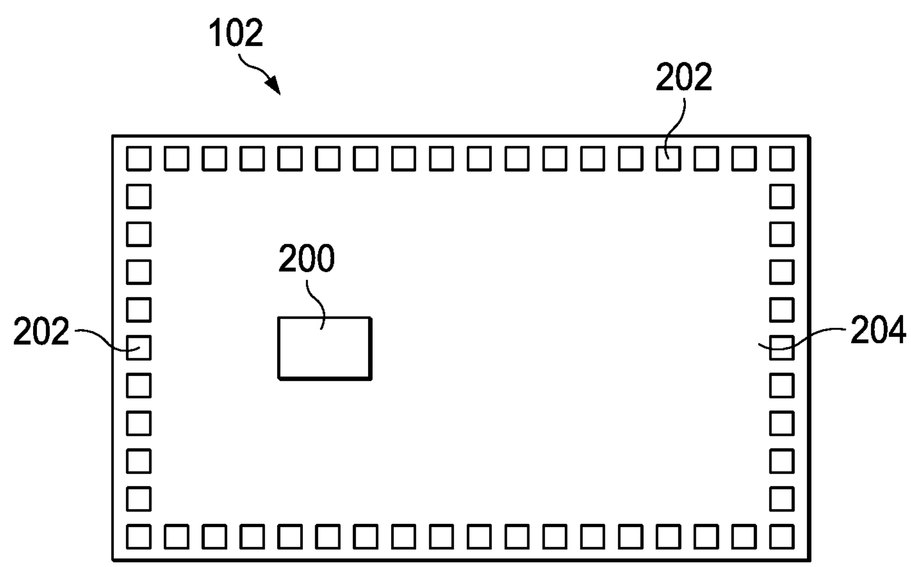

FIGS. 2A-12B together depict an example process flow implementing an example sensor packaging technique described herein. More specifically, FIG. 2A is a perspective view of a semiconductor die 102. As explained above, the semiconductor die 102 may be singulated from the wafer 100, or the semiconductor die 102 may be part of an intact wafer 100. For purposes of this description, it is assumed that the semiconductor die 102 is part of an intact wafer 100. The semiconductor die 102 includes a sensor 200 on an active surface 204. For example, the sensor 200 may be configured to sense any of a variety of physical properties, such as humidity, light, sound, pressure, bulk acoustic waves, stress, temperature, current, voltage, power, motion, acceleration, magnetic fields, and other physical properties. The active surface 204 of the semiconductor die 102 also may include other circuitry, such as an analog front end (AFE) circuit coupled to the sensor 200 that is configured to receive and process signals from the sensor 200 in an appropriate manner. For the sake of simplicity, such circuitry is not expressly shown in FIG. 2A. The semiconductor die 102 may further include multiple bond pads 202 that couple to circuitry on the active surface 204. FIG. 2B is a top-down view of the structure of FIG. 2A.

Figure 3A:
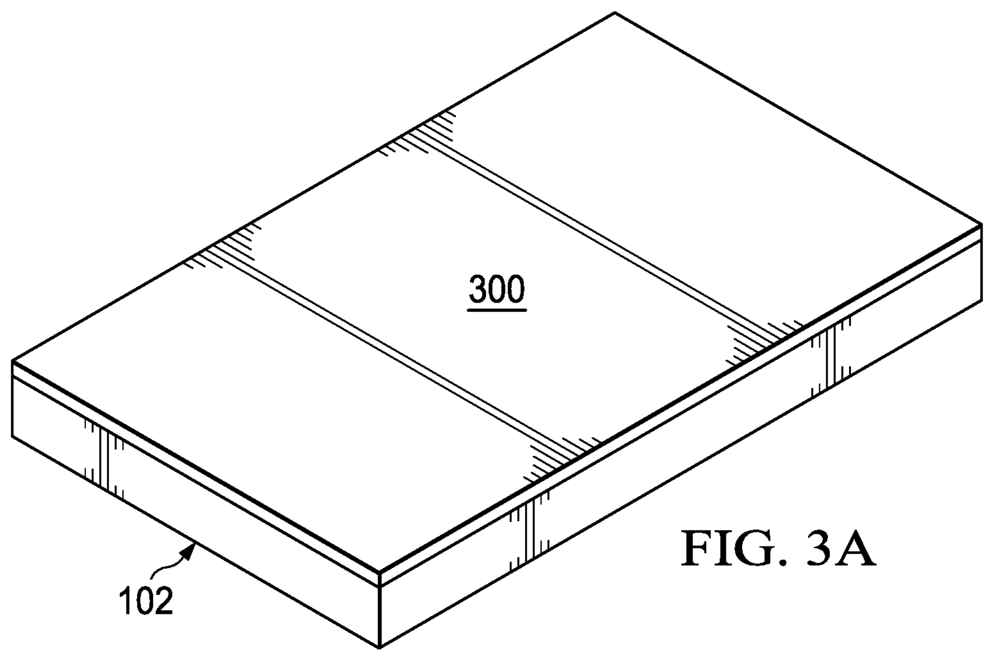
Figure 3B:
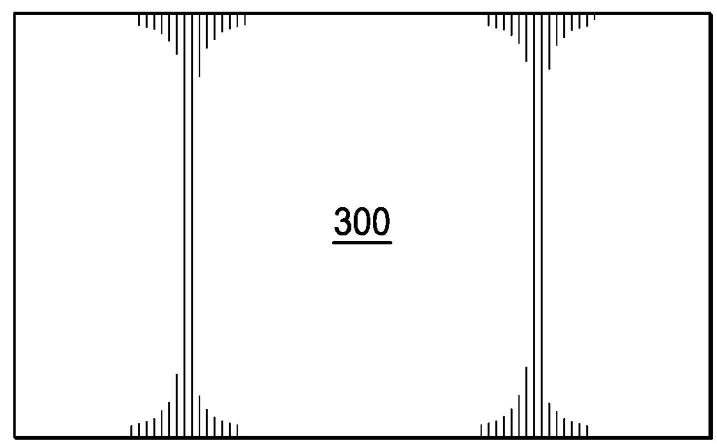

FIG. 3A is a perspective view of the semiconductor die 102 having a plating seed layer 300 deposited thereupon. For example, the plating seed layer 300 may be a titanium plating seed layer. For example, the plating seed layer 300 may be a titanium tungsten plating seed layer. The plating seed layer 300 may be positioned on the active surface 204 of the semiconductor die 102 using any appropriate technique. For example, the plating seed layer 300 may be positioned on the active surface 204 using a sputtering technique. The plating seed layer 300 may have any suitable physical dimensions. FIG. 3B is a top-down view of the structure of FIG. 3A.

Figure 4A:
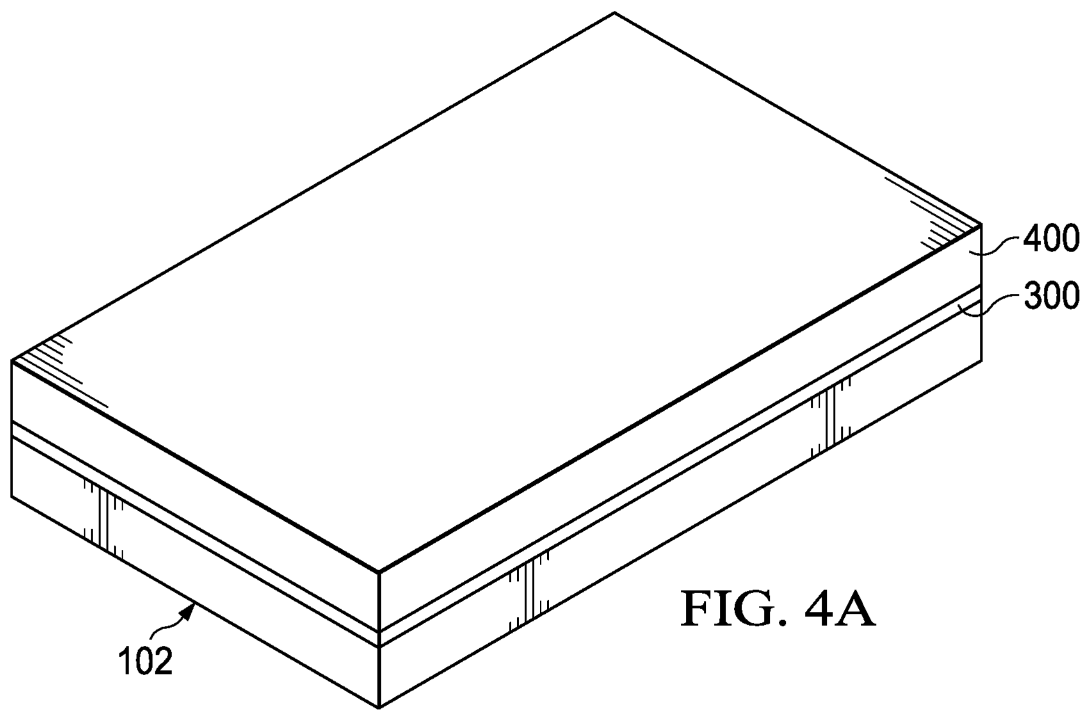
Figure 4B:
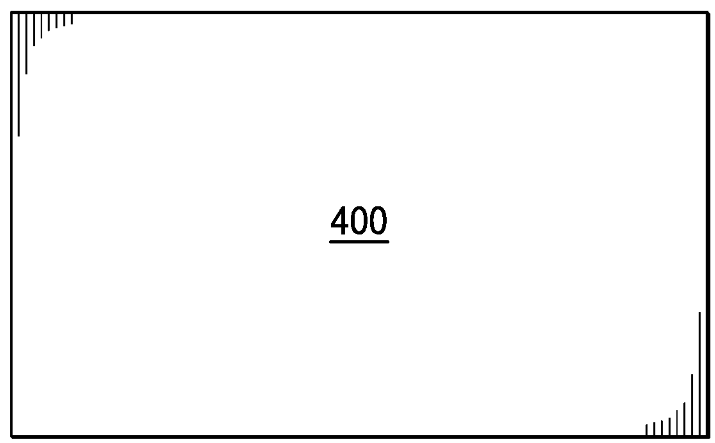

FIG. 4A is a perspective view of the semiconductor die 102, the plating seed layer 300, and a photoresist layer 400 on the plating seed layer 300. As will be described with reference to FIGS. 5A-8B, a photolithography and plating process is performed on the photoresist layer 400 to form a ring that circumscribes the sensor 200. As briefly explained above, such a ring may be used to prevent mold compound from covering the sensor 200 during a mold compound application process (e.g., in a mold chase). In examples, the photoresist layer 400 is thicker than the plating seed layer 300, although the scope of this disclosure is not limited as such. In examples, the thickness of the photoresist layer 400 determines a height of the ring described above. For instance, using a thicker photoresist layer 400 will produce a taller ring, and using a thinner photoresist layer 400 will produce a shorter ring. Target ring heights are application-specific and, as a result, any suitable thickness of the photoresist layer 400 that produces a target ring height may be used. For instance, taller rings may be more suitable for preventing mold compound from flowing onto the sensor 200 if the gap between the top and bottom members of a mold chase in which the mold compound is applied is greater, and shorter rings may be more suitable for applications in which the gap between the top and bottom mold chase members is smaller. In examples, the thickness of the photoresist layer 400 should be chosen so that the resulting ring is sufficiently short so that it fits within the mold chase that is to be used, but sufficiently tall so that it prevents mold compound from flowing onto the sensor 200 during application of the mold compound. Although the thickness of the photoresist layer 400 (and thus, the height of the ring) is application-specific, in examples, the thickness of the photoresist layer 400 ranges from 10 microns to 200 microns. FIG. 4B depicts a top-down view of the structure of FIG. 4A.

Figure 5A:
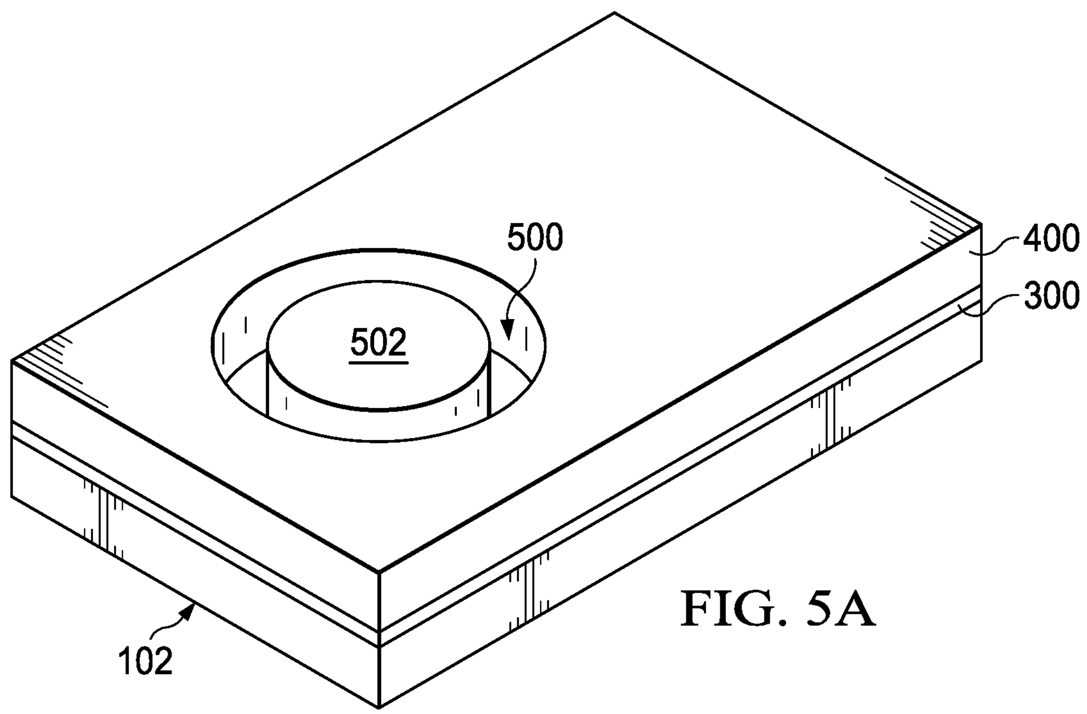
Figure 5B:
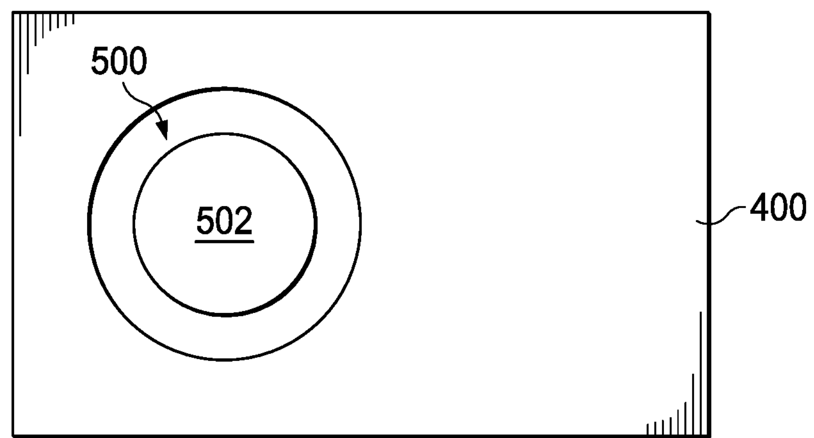

FIG. 5A is a perspective view of the structure of FIG. 4A after a photolithography process has been performed, e.g., after a suitably-patterned mask has been positioned above the photoresist layer 400, the area indicated by cavity 500 has been exposed, and the exposed area has been developed to remove the exposed area. As shown, the exposed and developed area may form a cavity 500 having a circular shape in a horizontal plane, with a platform 502 positioned in a center of the circle. In examples, the cavity 500 may have a different shape, such as an ovoid shape or a rectangular shape in the horizontal plane. In examples, the physical shape and the physical dimensions of the cavity 500 determine the physical shape and dimensions of the ring that is to be plated in the cavity 500. For example, a diameter of the cavity 500 (e.g., inner diameter or outer diameter) may be selected as desired to produce a ring with a target diameter (e.g., inner diameter or outer diameter). Similarly, the thickness of the cavity 500 (e.g., the shortest distance between the inner and outer perimeters of the cavity 500) may determine a thickness of the ring that is produced. In examples, the thickness of the cavity 500 (and, thus, the ring) ranges from 50 microns to 200 microns, with a smaller thickness providing the advantage of smaller form factors suitable for smaller applications (e.g., smartphones, digital watches, health monitors, etc.), and a greater thickness providing the advantage of robustness suitable for industrial applications (e.g., automotive, aviation, space, harsh conditions). In examples, the inner diameter of the cavity 500 (and, thus, the ring) ranges from 25 microns to 2 mm (e.g., in some examples, less than 100 microns), with a smaller inner diameter facilitating smaller package size, the inclusion of multiple sensors per package, reduced costs, and more precise control of direction and range of incident signals, and a greater inner diameter providing adequate protection for the sensor 200, a broader view of the incident signal, and better detection of weak signals. In examples where the cavity 500 is rectangular, the cavity 500 (and thus, the ring) may have a length ranging from 25 microns to 2 mm and a width ranging from 25 microns to 2 mm. In examples, the position of the cavity 500 also determines a position of the ring. For instance, as shown in FIG. 5A, the cavity 500 is positioned such that the platform 502 fully covers the sensor 200. FIG. 5B is a top-down view of the structure of FIG. 5A.

Figure 6A:
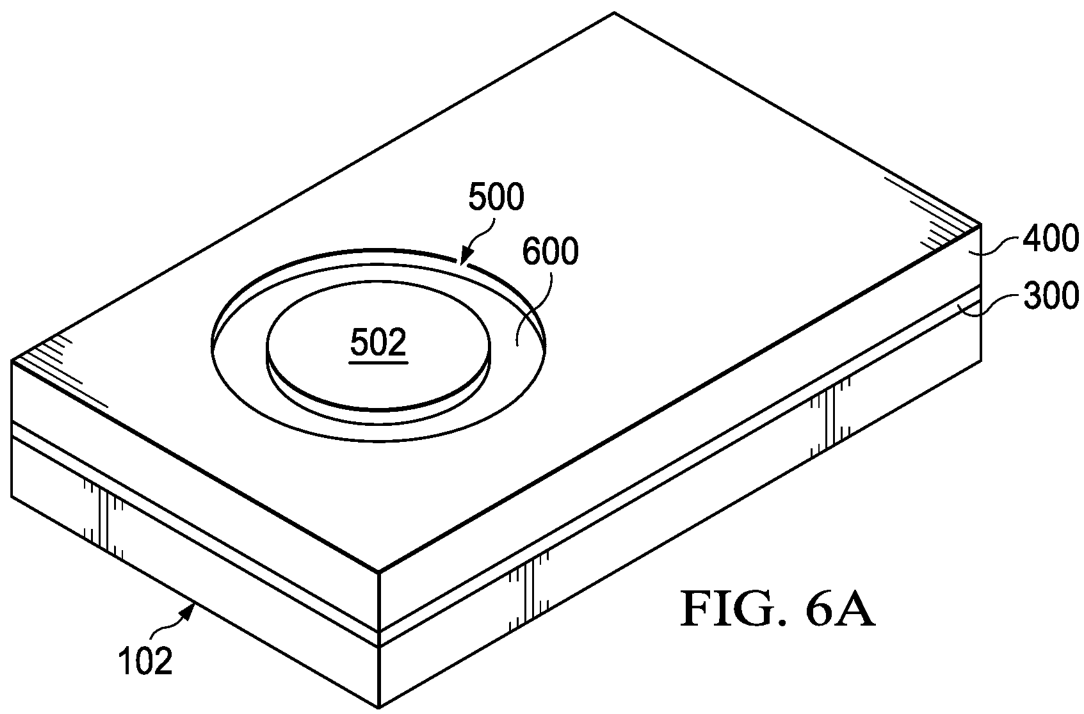
Figure 6B:
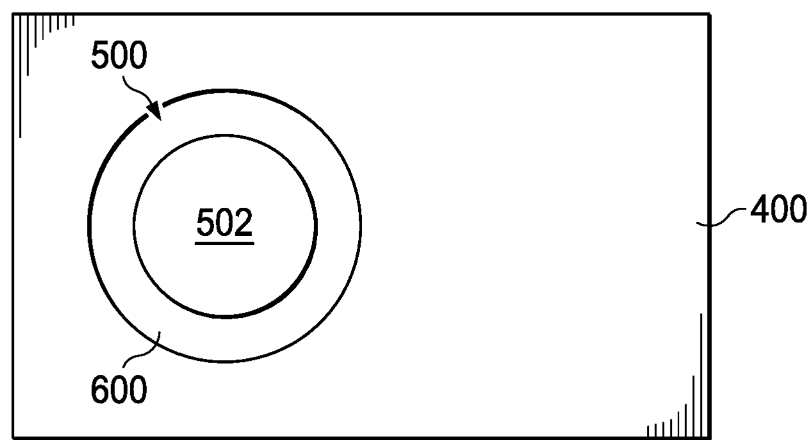

FIG. 6A depicts a plating (e.g., electroplating) process performed to fabricate a ring in the cavity 500. In particular, the plating seed layer 300 is used to plate a ring 600 filling the cavity 500. Because the ring 600 is plated inside the cavity 500, the ring 600 assumes the physical dimensions of the cavity 500, such as the diameter, thickness, and height of the cavity 500 as described above. Accordingly, the description provided above regarding the dimensions of the cavity 500 (whether circular/ovoid or rectangular) also applies to the ring 600 (whether circular/ovoid or rectangular). In examples, the ring 600 is plated so that a top surface of the ring 600 is flush with, or approximately flush with (e.g., within 1 millimeter of), a top surface of the photoresist layer 400. In examples, the ring 600 is composed of a metal such as copper, nickel, or aluminum. In examples, a top surface of the ring 600 may be plated with another layer or layers, such as nickel, nickel palladium, nickel gold, etc., in which case the top surface of this additional plating layer may be flush or approximately flush with the top surface of the photoresist layer 400. The drawings do not depict such optional plating layers on top of the ring 600. In examples, the greatest distance between the inner surface of the ring 600 and the sensor 200 is 5 microns or fewer. FIG. 6B is a top-down view of the structure of FIG. 6A.

Figure 7A:
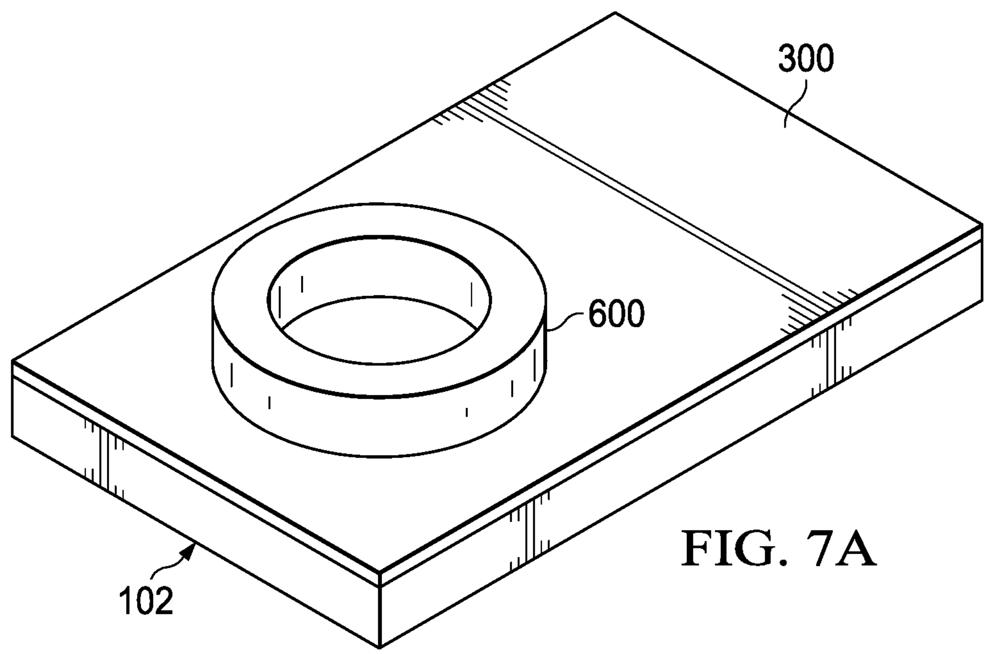
Figure 7B:
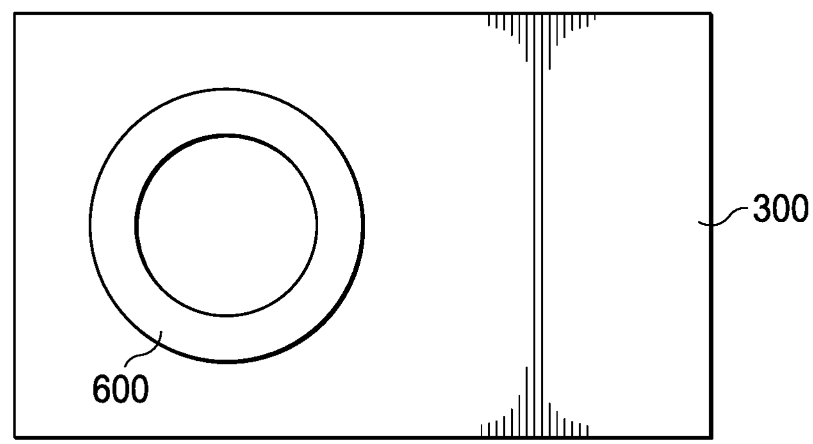
Figure 8A:
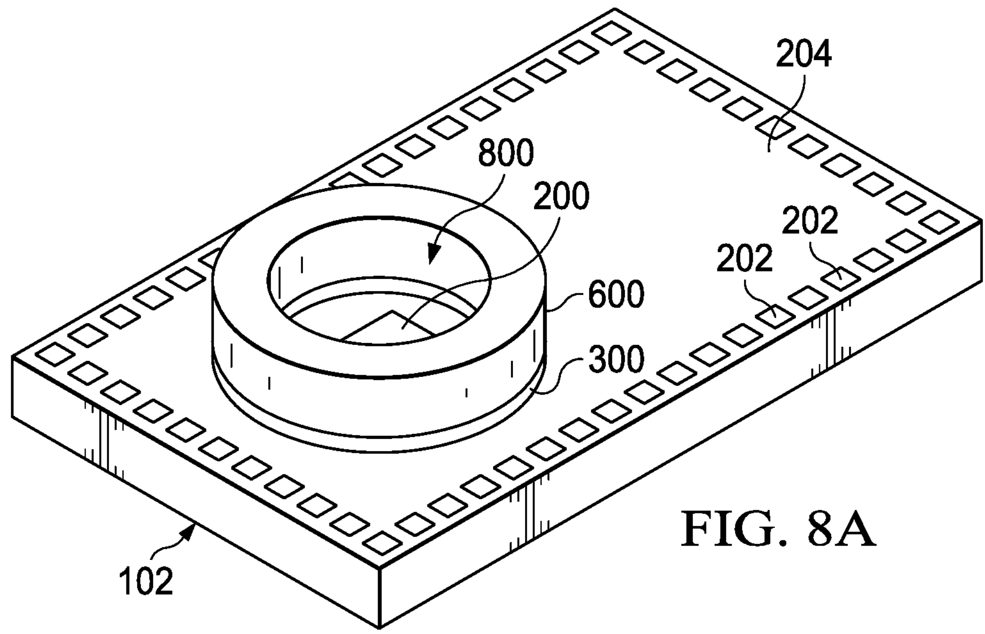
Figure 8B:
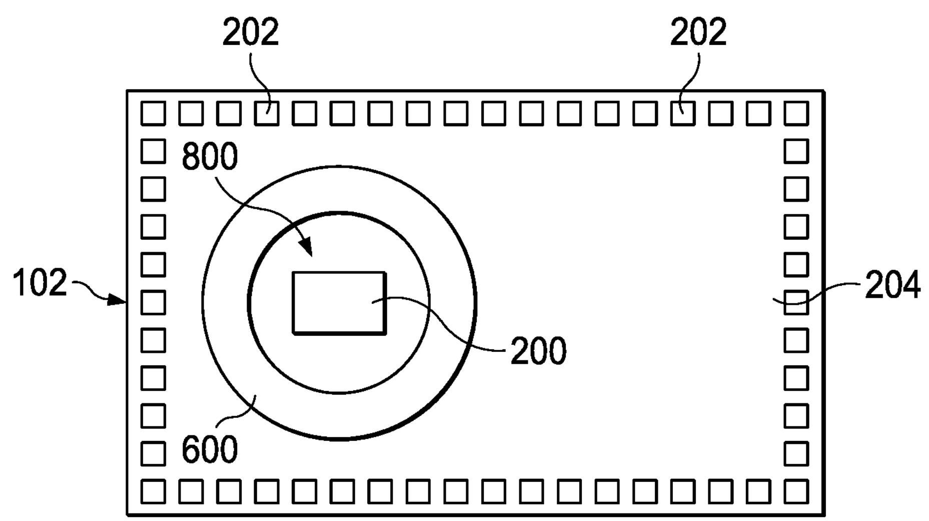

In FIG. 7A, the photoresist layer 400 is removed (e.g., stripped). FIG. 7B is a top-down view of the structure of FIG. 7A. The portion of the plating seed layer 300 that is not under the ring 600 is subsequently removed (e.g., chemically etched), leaving the structure shown in FIG. 8A. As FIG. 8A shows, the ring 600 is mechanically coupled to the semiconductor die 102 via the plating seed layer 300, which is between the ring 600 and the semiconductor die 102. As used herein, the term mechanically coupled means that a first component couples to a second component either directly or by way of a third component. A sensor cavity 800 is formed within the ring 600, and the sensor 200 is positioned inside the sensor cavity 800 as shown. As described below, when a mold compound is applied, the ring 600 prevents the mold compound from covering the sensor 200. FIG. 8B is a top-down view of the structure of FIG. 8A.

Figure 9A:
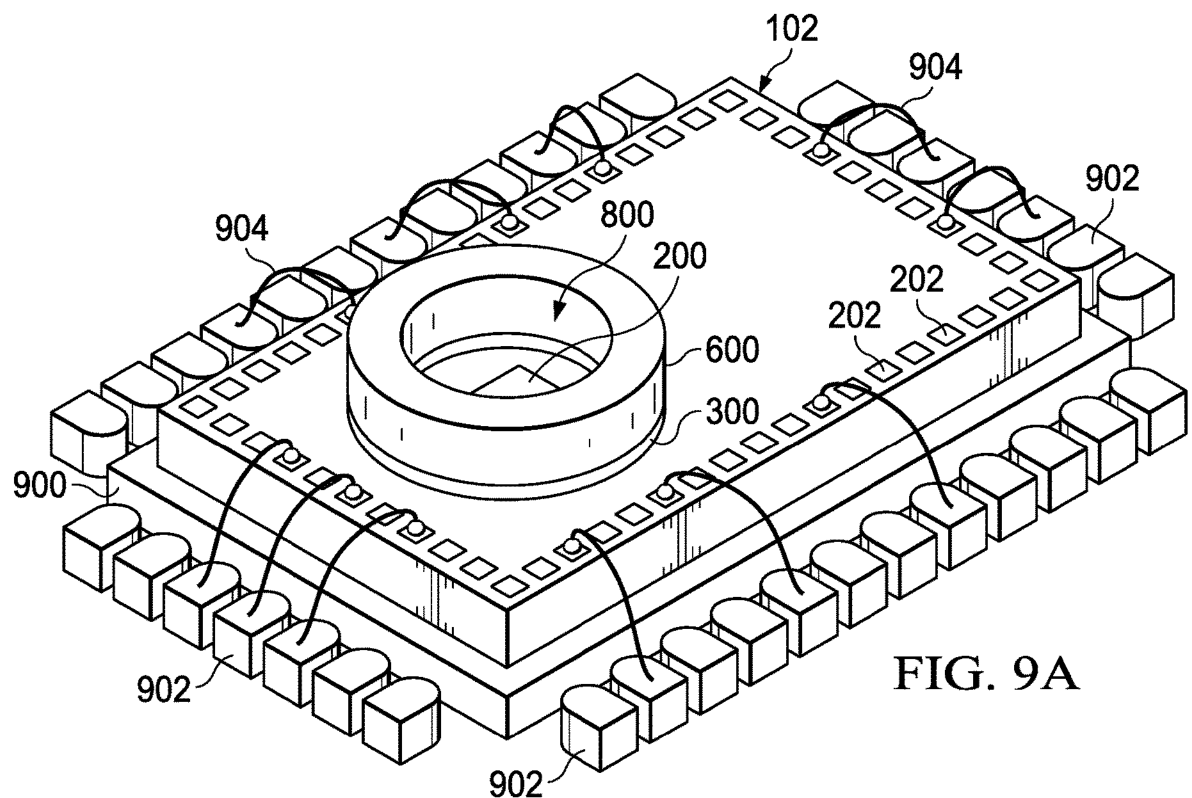
Figure 9B:
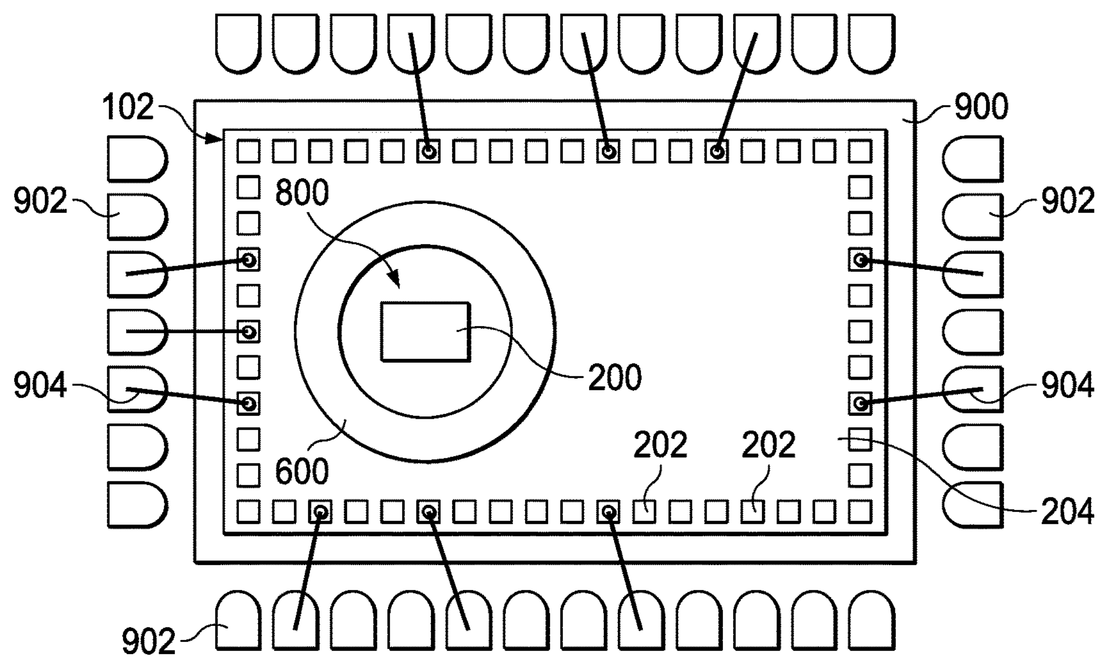

Assuming that the semiconductor die 102 is part of an intact wafer 100, the wafer 100 is then diced so that the semiconductor die 102 is separated from the wafer 100. The semiconductor die 102 is then coupled to a lead frame of a lead frame strip. For example, as FIG. 9A shows, the semiconductor die 102 is mounted on a die pad 900 of a lead frame. Bond pads 202 are coupled to conductive terminals 902 (e.g., leads) via bond wires 904. FIG. 9A shows a few illustrative bond wires 904, but in actual implementation, fewer or more bond wires 904 may be used. FIG. 9B is a top-down view of the structure of FIG. 9A.

Figure 10:
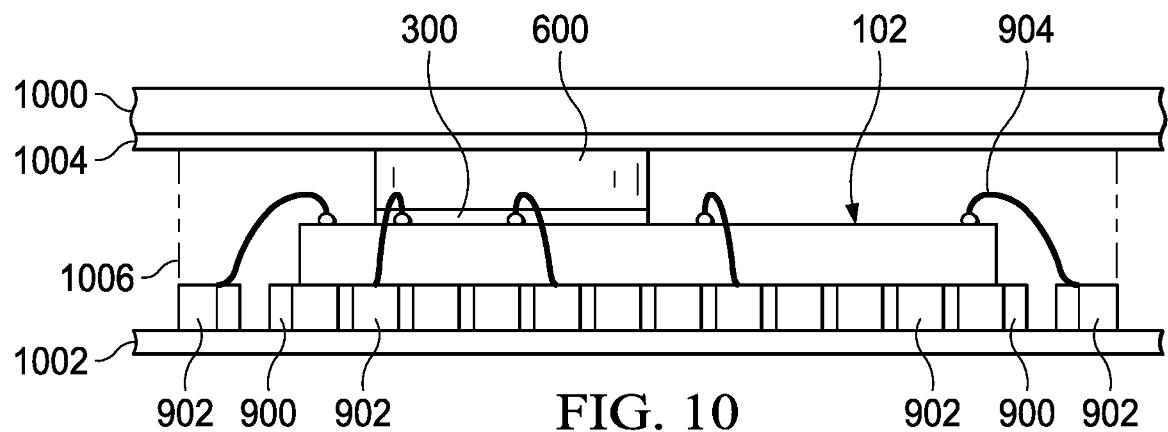

The structure of FIGS. 9A and 9B is subsequently covered using a mold compound. FIG. 10 depicts a mold chase having a top member 1000 and a bottom member 1002. The structure of FIGS. 9A and 9B is positioned inside the mold chase between the top member 1000 and bottom member 1002. In examples, the height of the ring 600 may be selected so that, when the structure of FIG. 9A is positioned inside the mold chase, the top surface of the ring 600 does not reach the bottom surface of the top member 1000. This gap may be filled by a film 1004, e.g., a film that is coupled to a bottom surface of the top member 1000. The film 1004 serves multiple purposes. One purpose of the film 1004 is to prevent mold compound 1006 from flowing into the sensor cavity 800 within the ring 600 and covering the sensor 200. Another purpose of the film 1004 is to mitigate a force transferred from the top member 1000 of the mold chase to the semiconductor die 102 via the ring 600. Without the film 1004, the ring 600 would make direct contact with the bottom surface of the top member 1000, in which case a deleterious force may be transferred from the top member 1000 to the semiconductor die 102 via the ring 600. Alternatively, without the film 1004, the ring 600 would not make direct contact with the bottom surface of the top member 1000, in which case mold compound 1006 would flow onto the sensor 200 and cover the sensor 200. To achieve these purposes, the film 1004 may have certain properties. For example, the film 1004 may be composed of materials such as single layer or multi-layer polymer materials (e.g., polyester, polyvinyl resin, etc.). In examples, the film 1004 may have a compressibility ranging from 20% to 50% of the original thickness of the film 1004 in the uncompressed state. For instance, in some such examples, a film 1004 that is 100 microns in thickness could be compressed by 20 microns to 50 microns, resulting in a film 1004 that has a thickness of 50 microns to 80 microns. In examples, the film 1004 has a compressibility that ranges from 50% to 80% of the uncompressed thickness of the film 1004. Adequate compressibility facilitates the mitigation of force being transferred to the semiconductor die 102 from the top member 1000 of the mold chase, but excessive compressibility may compromise the ability of the film 1004 to block mold compound flow. In examples, the film 1004 is sufficiently thick so that, when the mold chase is closed, the film 1004 and the ring 600 together block the undesirable flow of mold compound 1006 onto the sensor 200. FIG. 10 shows the film 1004 covering most or all of the bottom surface of the top member 1000, but in examples, the film 1004 is smaller so as to cover that portion of the bottom surface of the top member 1000 that aligns with the ring 600. In yet other examples, the film 1004 is shaped to match a shape of the ring 600. By reducing the size of the film 1004, the mold compound 1006 may flow more freely and the creation of irregularities may be avoided. Conversely, reducing the size of the film 1004 may cause alignment problems when the mold chase is closed, e.g., the film 1004 may not make proper contact with the top surface of the ring 600.

Figure 11B:
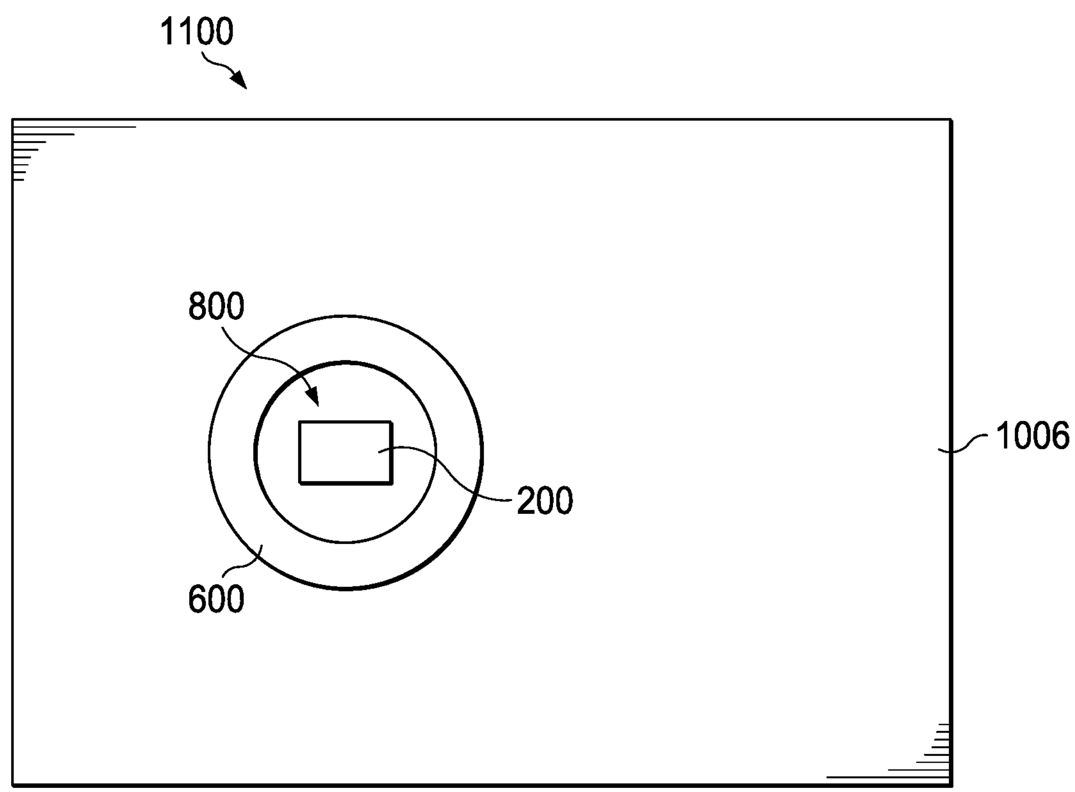
Figure 11A:
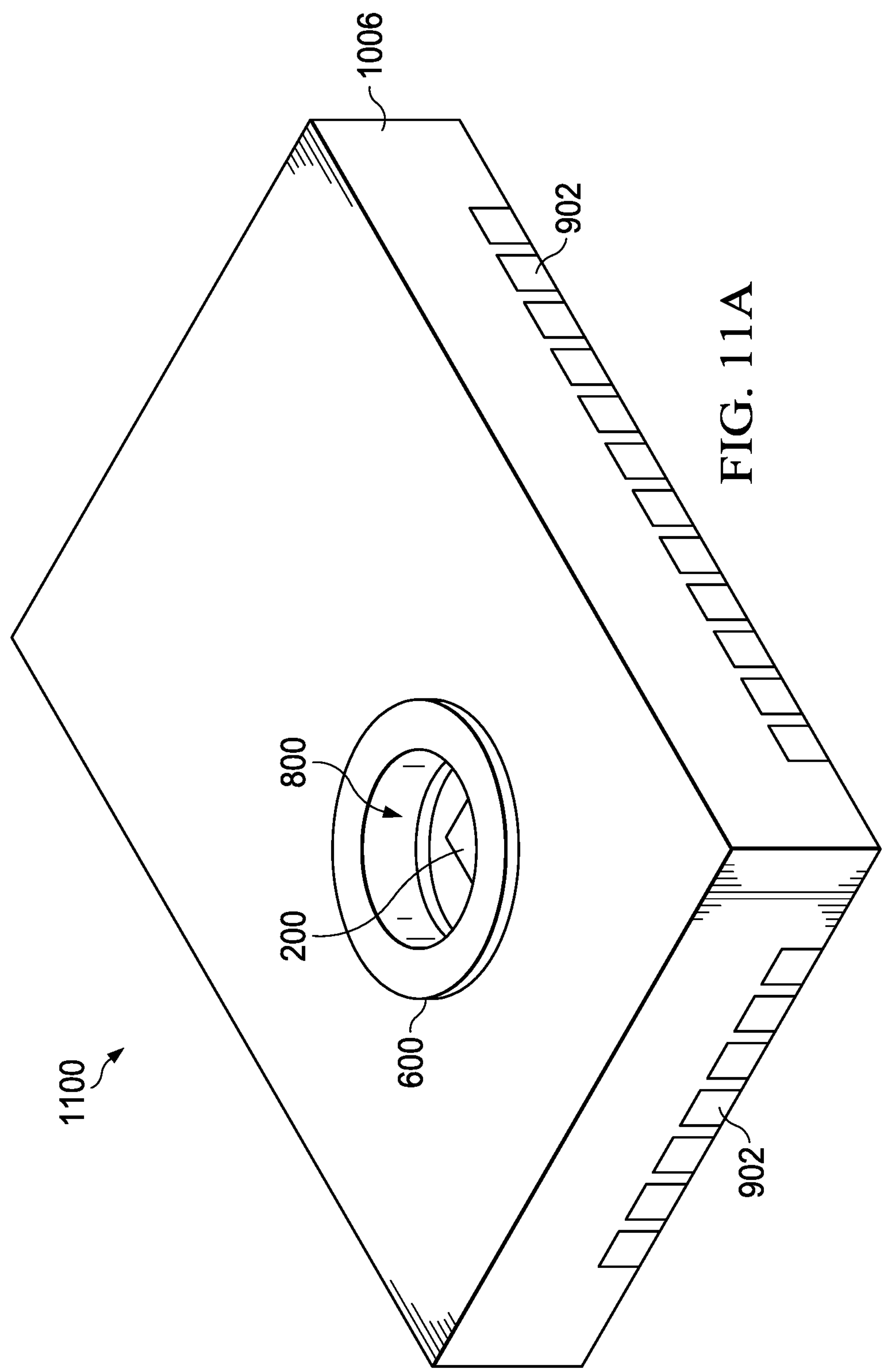

After application of the mold compound 1006, the resulting structure is decoupled from the remainder of the lead frame strip, thereby producing the structure shown in FIG. 11A. In particular, FIG. 11A is a perspective view of a completed sensor package 1100. The sensor 200 is in the sensor cavity 800 which is formed by the ring 600 in the mold compound 1006. The sensor 200 and the inner surface of the sensor cavity 800 are thus exposed to an exterior environment of the sensor package 1100. In examples, a top surface of the ring 600 is flush or approximately flush (e.g., within 1 millimeter of) the top surface of the mold compound 1006. Conductive terminals 902 are exposed to an exterior surface of the mold compound 1006, as shown. In operation, the sensor 200 senses a physical property in the exterior environment of the sensor package 1100. The sensor 200 sends analog signals to the AFE circuit on the semiconductor die 102, which processes the analog signals from the sensor 200 and provides the processed signals to other circuitry either on the semiconductor die 102 or on a different semiconductor die for further processing and/or use. FIG. 11B is a top-down view of the structure of FIG. 11A.

Figure 12A:
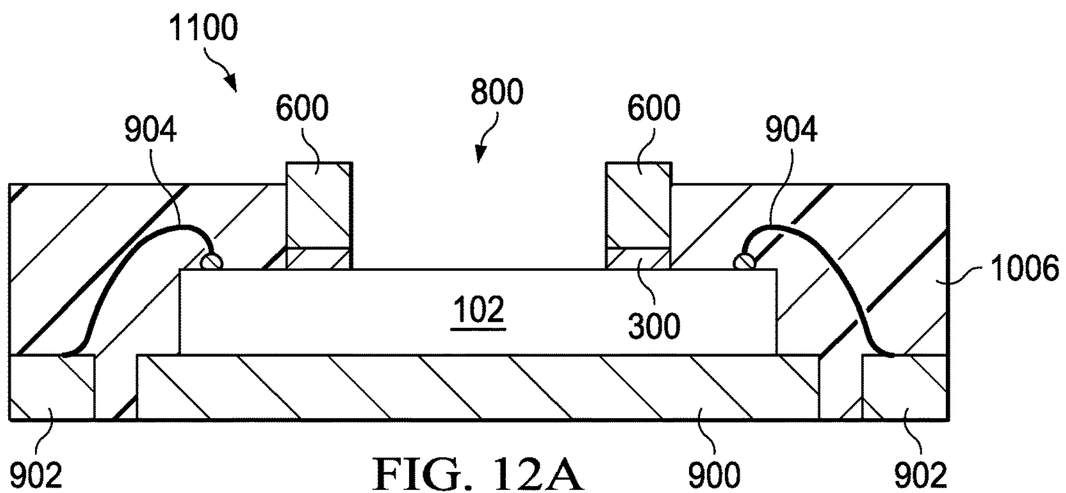
Figure 12B:
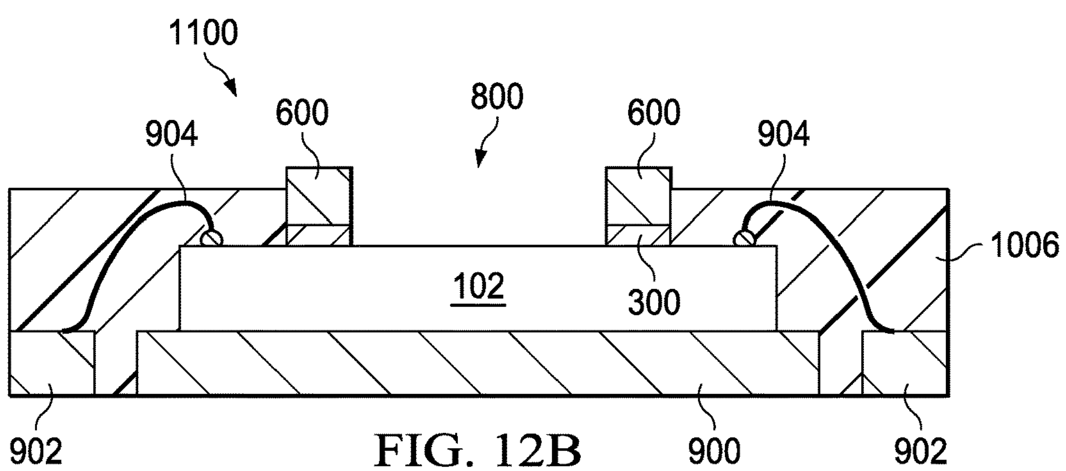
Figure 12C:
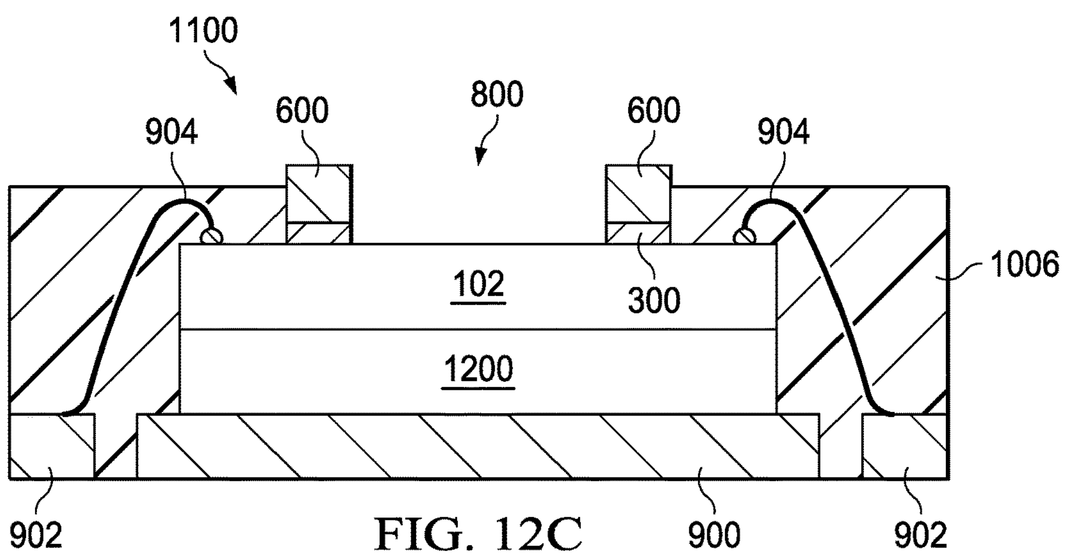

FIG. 12A is a cross-sectional profile view of the sensor package 1100. The height of the ring 600 may be reduced relative to the height shown in FIG. 12A by multiple techniques. As shown in FIG. 12B, in some examples, a smaller mold chase may be used so that the overall thickness of the sensor package 1100 is decreased. By decreasing the thickness of the sensor package 1100, the ring 600 may not be as tall as is the case in FIG. 12A. As shown in FIG. 12C, in some examples, a platform 1200 without electrical functionality (e.g., a "dummy" die) may be positioned between the semiconductor die 102 and the die pad 900 to elevate the semiconductor die 102. The size of the mold chase is kept the same as that used for the sensor package 1100 of FIG. 12A. By elevating the semiconductor die 102, the ring 600 may not be as tall as shown in FIG. 12A.

Figure 13:
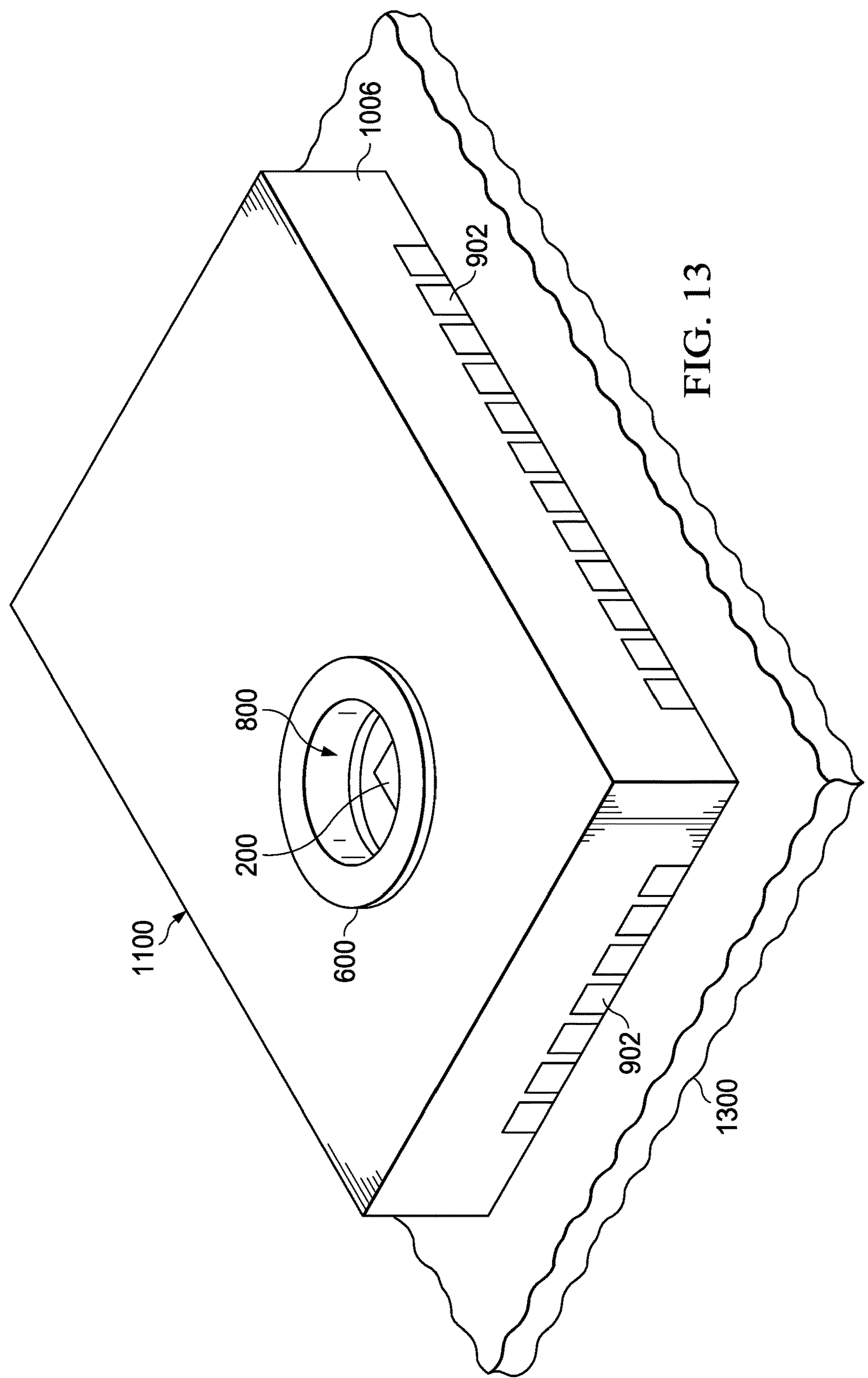

FIG. 13 is a perspective view of the sensor package 1100 mounted on a printed circuit board (PCB) 1300. Other circuits, semiconductor packages, etc. also may be mounted on the PCB 1300, and the sensor package 1100 may communicate with such components. For example, the AFE circuit in the sensor package 1100 may communicate signals encoding sensed measurements of physical properties to other circuits on the PCB 1300.

As explained above, sensor cavities formed using conventional techniques cannot be decreased in size to the degree suitable to fit multiple sensor cavities (and sensors) on a single sensor package, or to the degree suitable to decrease the size of a sensor package having a single sensor cavity (and sensor). However, the photolithography and plating techniques described above with respect to FIGS. 2A-11B are highly precise and enable the fabrication of sensor cavities that are substantially smaller than conventional sensor cavities. Accordingly, in examples, the sensor cavity 800 has a diameter range equivalent to the inner diameter range of the ring 600 and the cavity 500, as described above. In contrast, conventionally-formed sensor cavities have substantially larger diameters ranging from 1 mm to 5 mm. Similarly, sensor cavities 800 having a rectangular shape may have a length range of 0.02 mm to 3 mm and a width range of 0.02 mm to 3 mm, and in contrast, conventionally-formed sensor cavities with rectangular shapes may have a length range of 1 mm to 5 mm and a width range of 1 mm to 5 mm.

Figure 14:
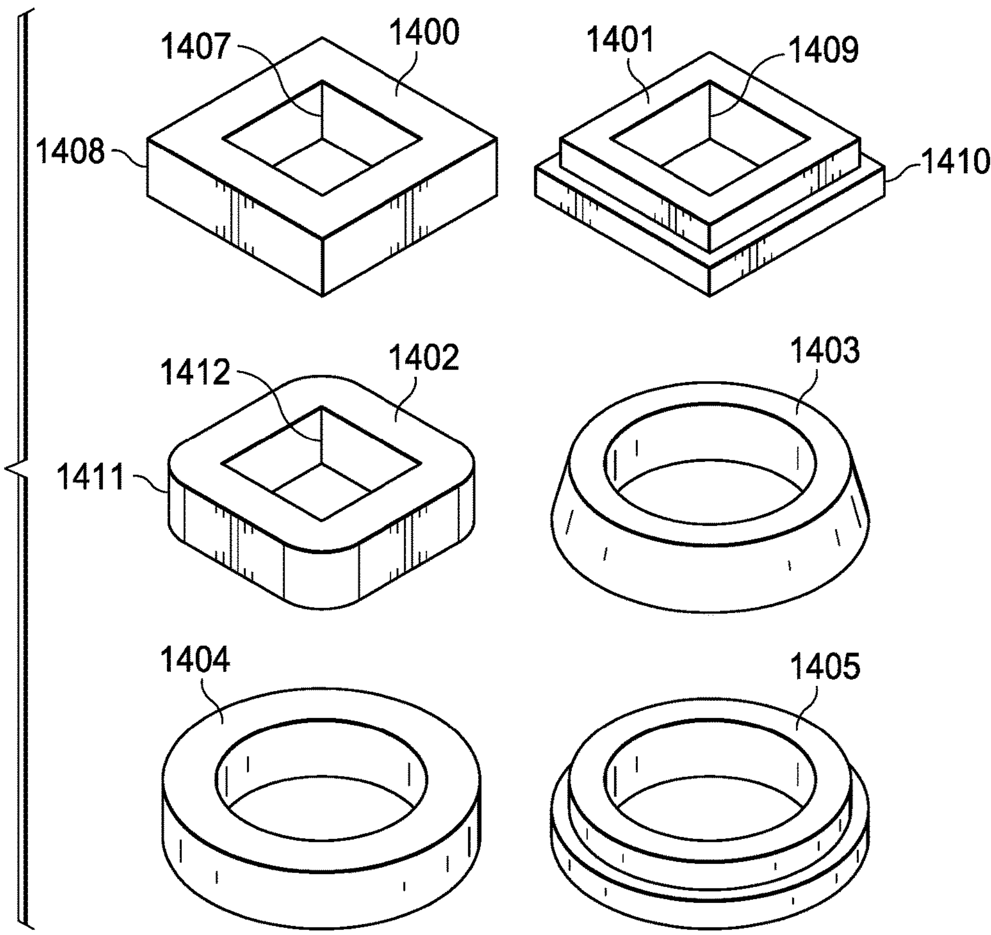

Although the above-described photolithography and plating techniques are sufficiently precise to form sensor cavities 800 of relatively small size, other high-precision techniques also may be used to form small sensor cavities. In some examples, the photolithography and plating processes described above may be omitted, and rings fabricated separately (e.g., pre-fabricated rings) from the semiconductor die may be used instead. FIG. 14 depicts seven example pre-fabricated rings 1400-1405, with each ring 1400-1405 having maximal physical dimensions matching the example dimensions given above for the ring 600 (whether circular/ovoid or rectangular) and/or cavity 500 (whether circular/ovoid or rectangular). The example rings 1400-1405 may be composed of metal (e.g., copper, nickel, aluminum, steel, metal alloys) or non-metal (e.g., ceramic, plastic, fiber) materials. In examples, the rings 1400-1405 may be punched or cut from a foil or a metal sheet. For instance, a sheet of metal (e.g., 30 gauge) may be punched or etched to form cavities, and the sheet may then be mounted to a saw tape on a flex frame. The flex frame may then be stretched and the sheet metal may be cut (e.g., using a diamond blade) into individual rings, which may then be mounted on top of the semiconductor die 102.

The example ring 1400 has a rectangular shape with right-angle inner and outer corners 1407, 1408 and an approximately uniform thickness. The example ring 1401 is similar to the rectangular ring 1400 with right-angle inner and outer corners 1409, 1410, but the ring 1401 includes a stairstep pattern on an outer surface of the ring 1401. The stairstep pattern enables greater adhesive strength between the ring 1401 and the mold compound abutting the ring 1401. The example ring 1402 has a rectangular shape with rounded outer corners 1411 and right-angle inner corners 1412. The example ring 1403 has a circular shape with a vertical inner surface and a slanted outer surface. Like the stairstep pattern, the slanted outer surface enables greater adhesive strength between the ring 1403 and the mold compound abutting the ring 1403. The example ring 1404 is similar to the ring 1403 except that it has a vertical outer surface instead of a slanted outer surface. The example ring 1405 has a circular shape similar to that of the ring 1404, except that the ring 1405 has a stairstepped outer surface, as shown. The rings 1400-1405 are merely examples. The scope of this disclosure is not limited to the example rings 1400-1405. Regardless of the shape of the ring used, the ring may be coupled to the semiconductor die 102 at any suitable time prior to application of the mold compound 1006. For example, the ring may be positioned on the semiconductor die 102 prior to singulation of the semiconductor die 102 from the wafer 100 (e.g., using a gang-array technique to increase efficiency), after singulation (e.g., with the semiconductor die 102 positioned inside the mold chase), or at any other suitable time prior to application of the mold compound 1006. In examples, the ring is coupled to the semiconductor die 102 using an adhesive, solder, epoxy, etc.

Figure 15:
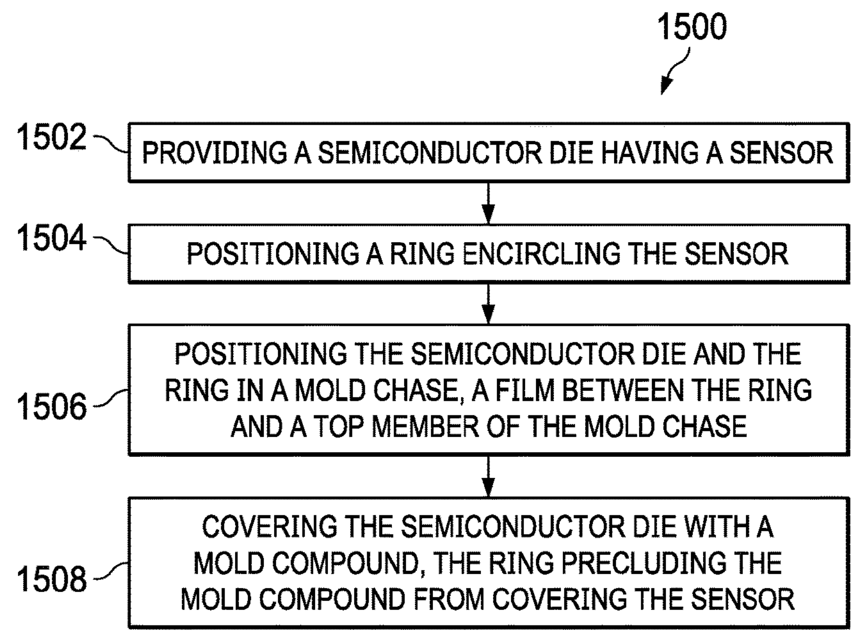
FIG. 15 is a flow diagram of a method for manufacturing a sensor package having a miniature sensor cavity formed by a ring circumscribing a sensor on a semiconductor die, in accordance with various examples.

FIG. 15 is a flow diagram of a method 1500 that summarizes the techniques and process flows described above with respect to FIGS. 2A-14. The method 1500 begins with providing a semiconductor die having a sensor (1502). The method 1500 includes positioning a ring encircling the sensor (1504). As explained in detail above, the ring may be positioned encircling the sensor using a photolithography and plating technique. As also explained above, the ring may be pre-fabricated and coupled to the semiconductor die and encircling the sensor using an adhesive. In either case, the precision of the technique used is superior to that used in conventional techniques to form sensor cavities, and thus the sizes of the resulting sensor cavities are significantly smaller than conventional sensor cavities. As a result, the various challenges described above are mitigated. The method 1500 comprises positioning the semiconductor die and the ring in a mold chase, with a film between the ring and a top member of the mold chase (1506). As explained, this film (e.g., film 1004 in FIG. 10) mitigates forces transferred to the semiconductor die from the top member of the mold chase and via the ring. Further, this film prevents mold compound from flowing between the top of the ring and the top member of the mold chase and into the sensor cavity, thus protecting the sensor from being covered by the mold compound. The method 1500 includes covering the semiconductor die with a mold compound, with the ring (and, in examples, the film) precluding the mold compound from covering the sensor (1508).

The above description primarily relates to the formation of sensor cavities using rings (e.g., ring 600), which results in the various benefits and advantages described above. However, other techniques for the formation of sensor cavities may be used in lieu of a ring. For example, a solid member (e.g., a stud) may be used to prevent mold compound from covering a sensor during the packaging process, thereby forming a sensor cavity in the mold compound of the sensor package. Various examples of techniques for the formation of sensor cavities using such solid members are now described in relation to FIGS. 16A-35.

Figure 16A:
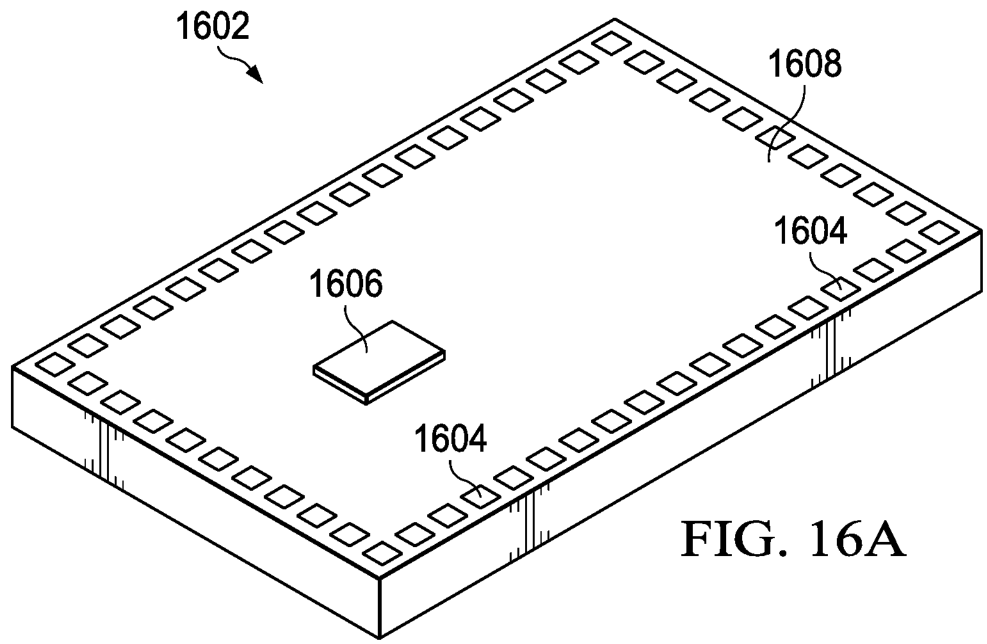
FIGS. 16A-35 depict process flows for manufacturing a sensor package having a miniature sensor cavity, in accordance with various examples.
Figure 16B:
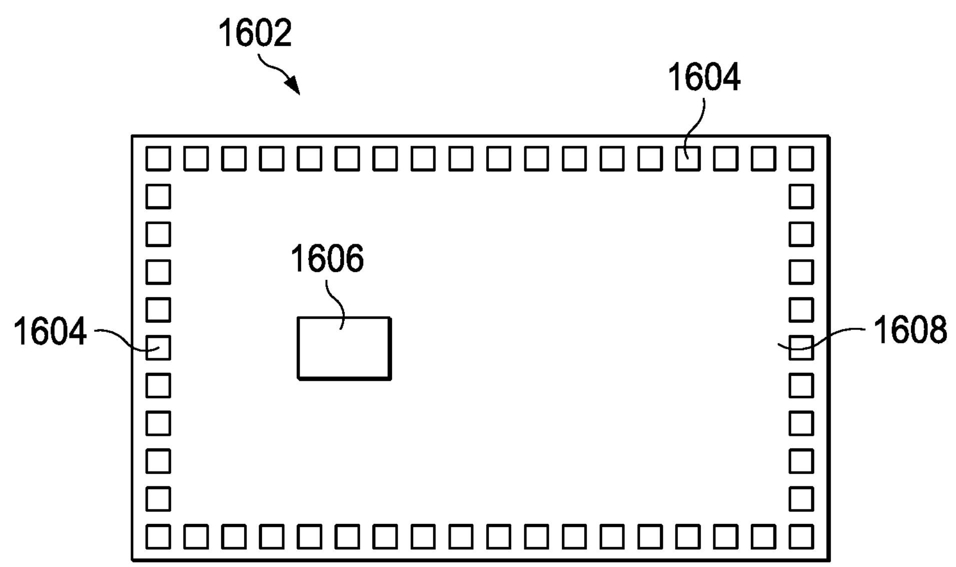
Figure 17A:
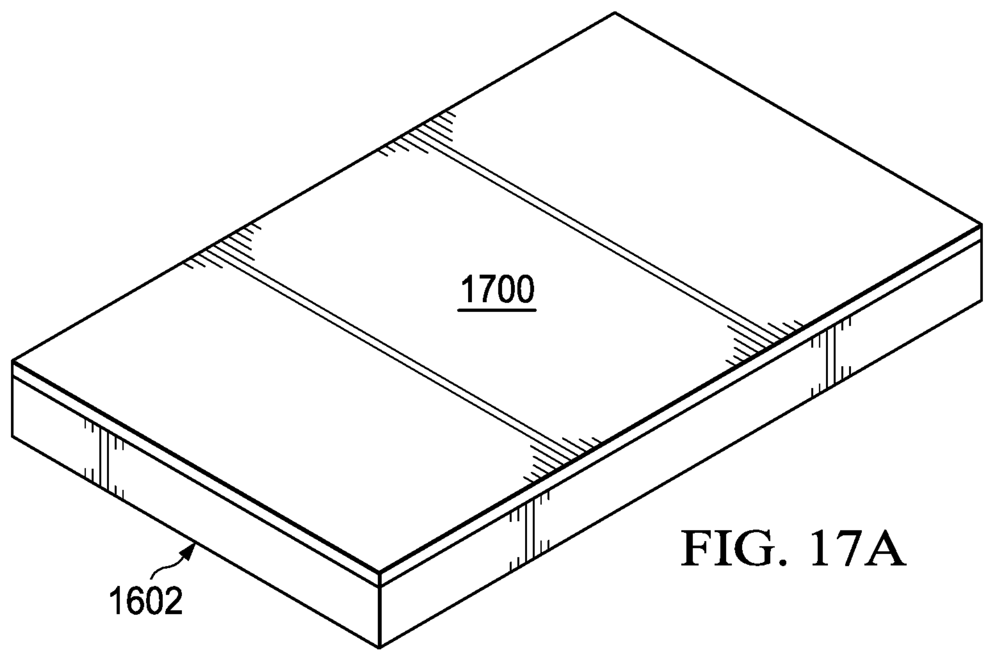
Figure 17B:
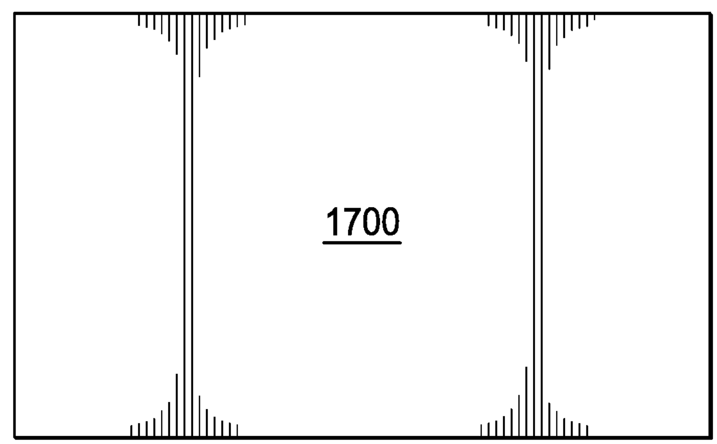
Figure 18A:
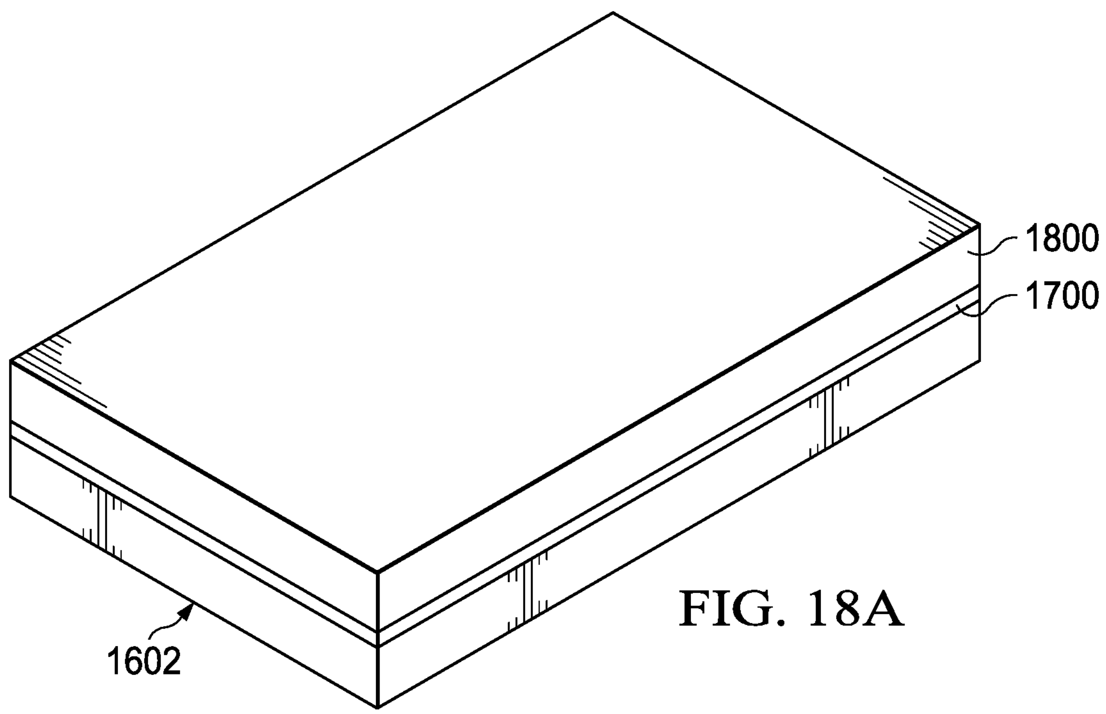
Figure 18B:
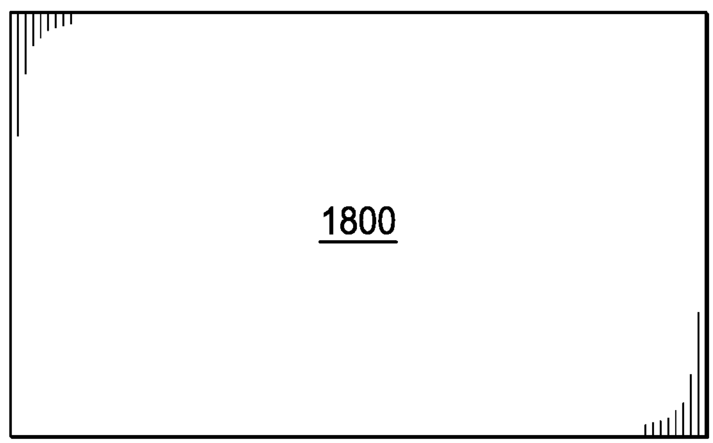
Figure 19A:
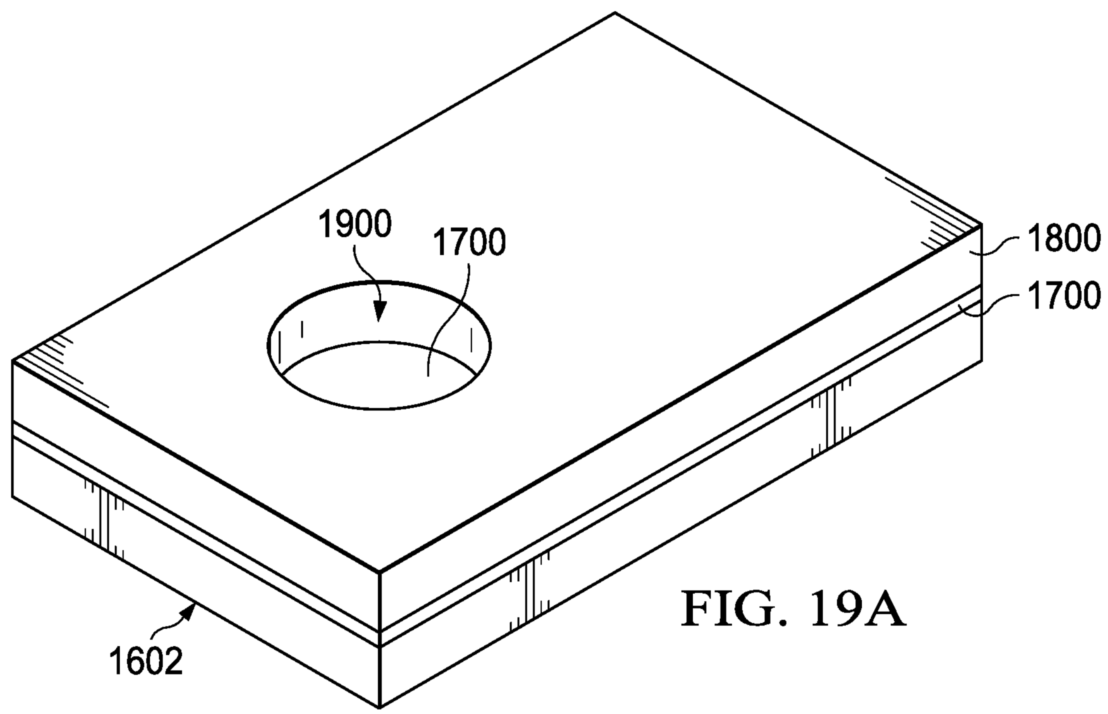
Figure 19B:
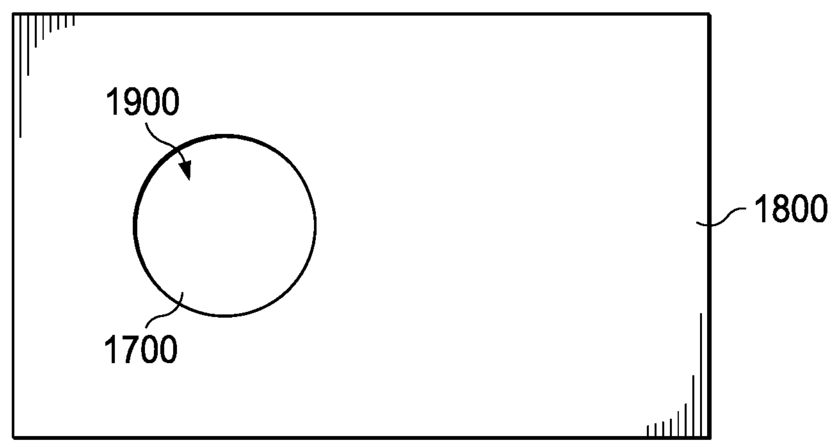

FIG. 16A is a perspective view of a semiconductor die 1602 having an active surface 1608, which, in turn, has a sensor 1606. The active surface 1608 also includes multiple bond pads 1604. FIG. 16B is a top-down view of the structure of FIG. 16A. FIG. 17A is a perspective view of the semiconductor die 1602 having a seed layer 1700 deposited thereupon. In examples, the seed layer 1700 includes a metal such as titanium, titanium tungsten, etc. FIG. 17B is a top-down view of the structure of FIG. 17A. FIG. 18A is a perspective view of the semiconductor die 1602 with the seed layer 1700 and a photoresist layer 1800 on the seed layer 1700. The description provided above for the plating seed layer 300 applies to the seed layer 1700, and the description provided above for the photoresist layer 400 applies to the photoresist layer 1800. FIG. 18B is a top-down view of the structure of FIG. 18A. FIG. 19A is a perspective view of the structure of FIG. 18A, except with a sensor cavity 1900 formed in the photoresist layer 1800 such that the seed layer 1700 is exposed through the sensor cavity 1900. In examples, an appropriately-patterned mask is used to expose the area of the photoresist layer 1800 corresponding to the sensor cavity 1900, and this area of the photoresist layer 1800 is subsequently exposed to form the sensor cavity 1900. In examples, the sensor cavity 1900 is formed above the sensor 1606. In examples, the sensor cavity 1900 and the semiconductor die 1602 have a combined thickness (or depth) approximately equivalent to that of the mold chase used to apply a mold compound to the structure of FIG. 19A. In examples, the sensor cavity 1900 and the semiconductor die 1602 have a combined thickness approximately equivalent to that of a target sensor package thickness. In examples, in a horizontal plane the sensor cavity 1900 is circular, and in other examples, the sensor cavity 1900 has an ovoid or rectangular shape. Other shapes are contemplated and included in the scope of this disclosure.

Figure 20A:
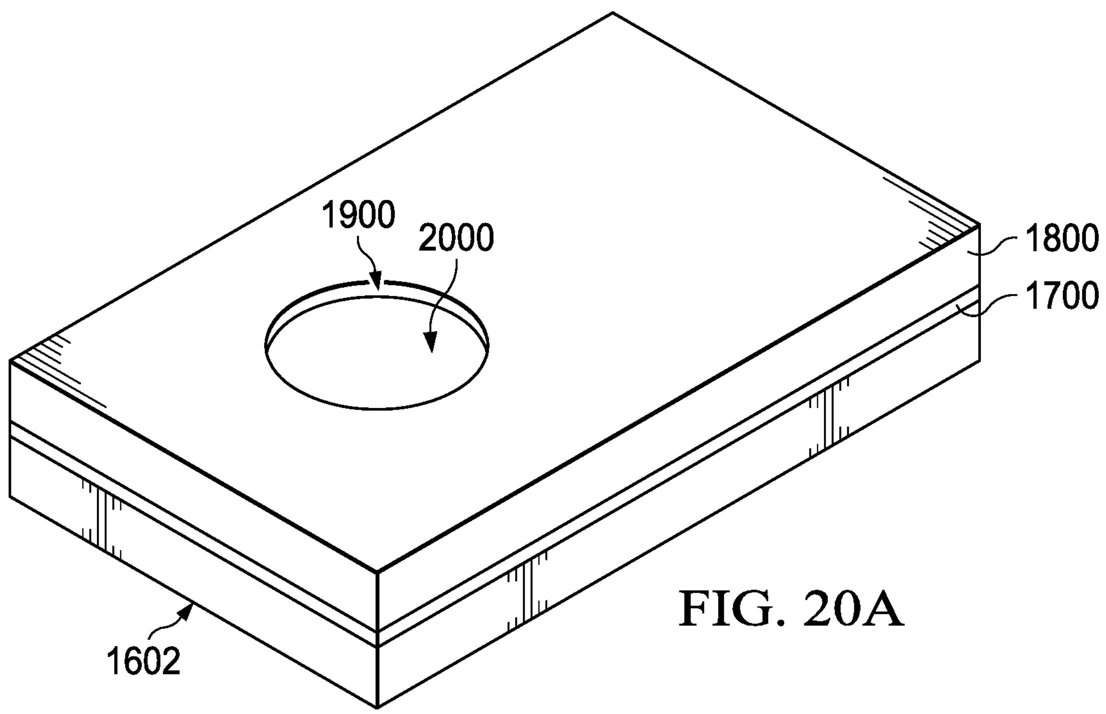
Figure 20B:
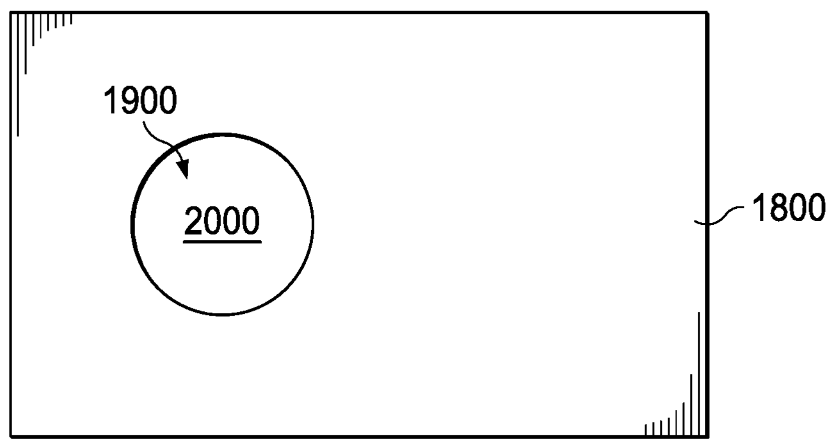

FIG. 20A is a perspective view of the structure of FIG. 19A, with a solid member 2000 having been plated (e.g., electroplated) in the sensor cavity 1900 using the seed layer 1700. In examples, the solid member 2000 is composed of a metal such as copper, nickel, aluminum, etc. Because the solid member 2000 is plated within the sensor cavity 1900, the solid member 2000 takes the form of the sensor cavity 1900, having the same shape and size as the sensor cavity 1900. In examples, the sensor cavity 1900, and thus the solid member 2000, has a diameter sufficiently large to cover all of the sensor 1606. In examples, no dimension of the sensor cavity 1900 in the horizontal plane (e.g., diameter, length, or width) exceeds 0.90 mm, which is made possible due to the precise photolithography and plating processes described herein that are used to form the sensor cavity 1900. In examples, the greatest distance between the sensor 1606 and the outer surface of the solid member 2000 is no more than 5 microns. FIG. 20B is a top-down view of the structure of FIG. 20A.

Figure 21A:
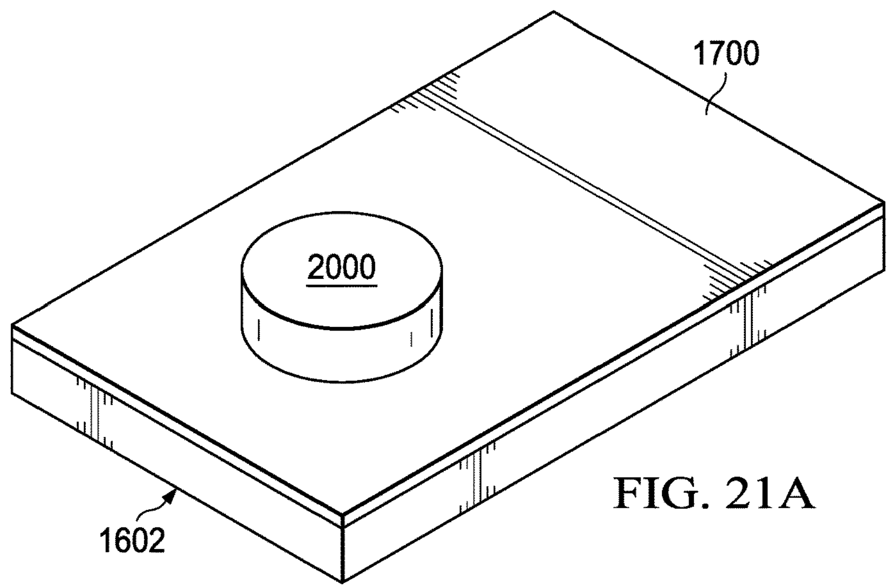
Figure 21B:
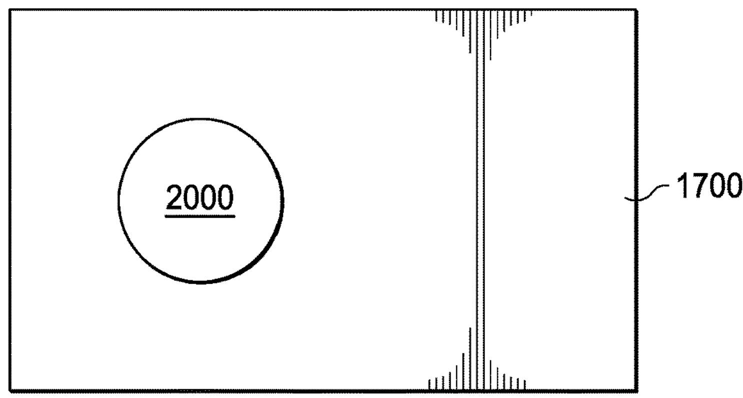
Figure 22A:
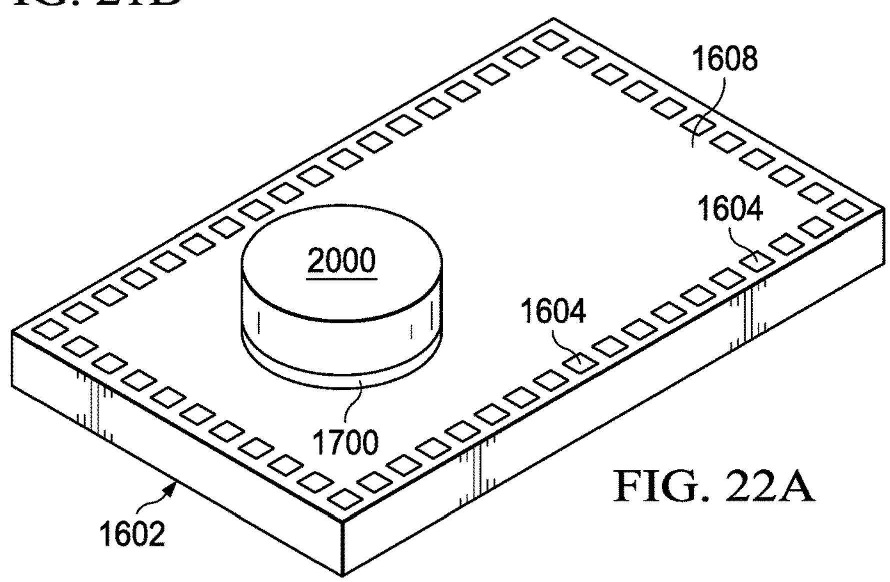
Figure 22B:
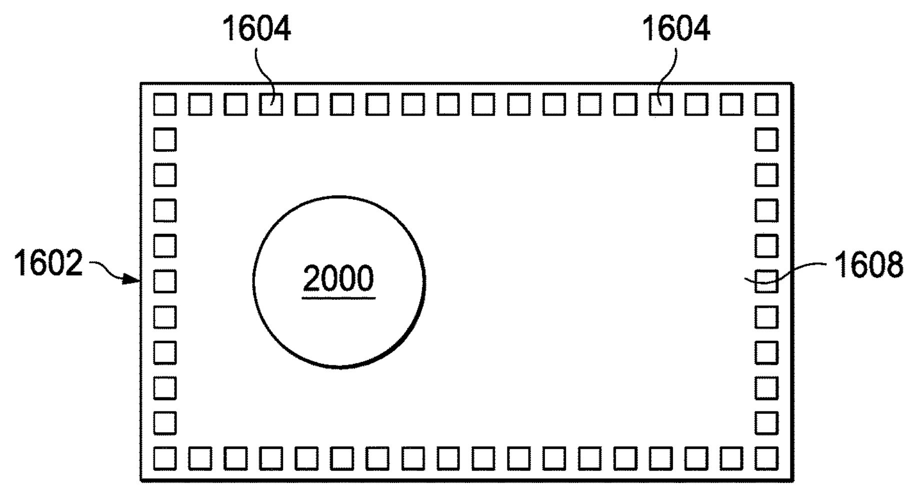

FIG. 21A is a perspective view of the structure of FIG. 20A with the photoresist layer 1800 removed (e.g., stripped). FIG. 21B is a top-down view of the structure of FIG. 21A. FIG. 22A is a perspective view of the structure of FIG. 21A, except with the seed layer 1700 removed (e.g., chemically etched). However, the seed layer 1700 is not removed from under the solid member 2000, as shown. FIG. 22B is a top-down view of the structure of FIG. 22A.

Figure 23A:
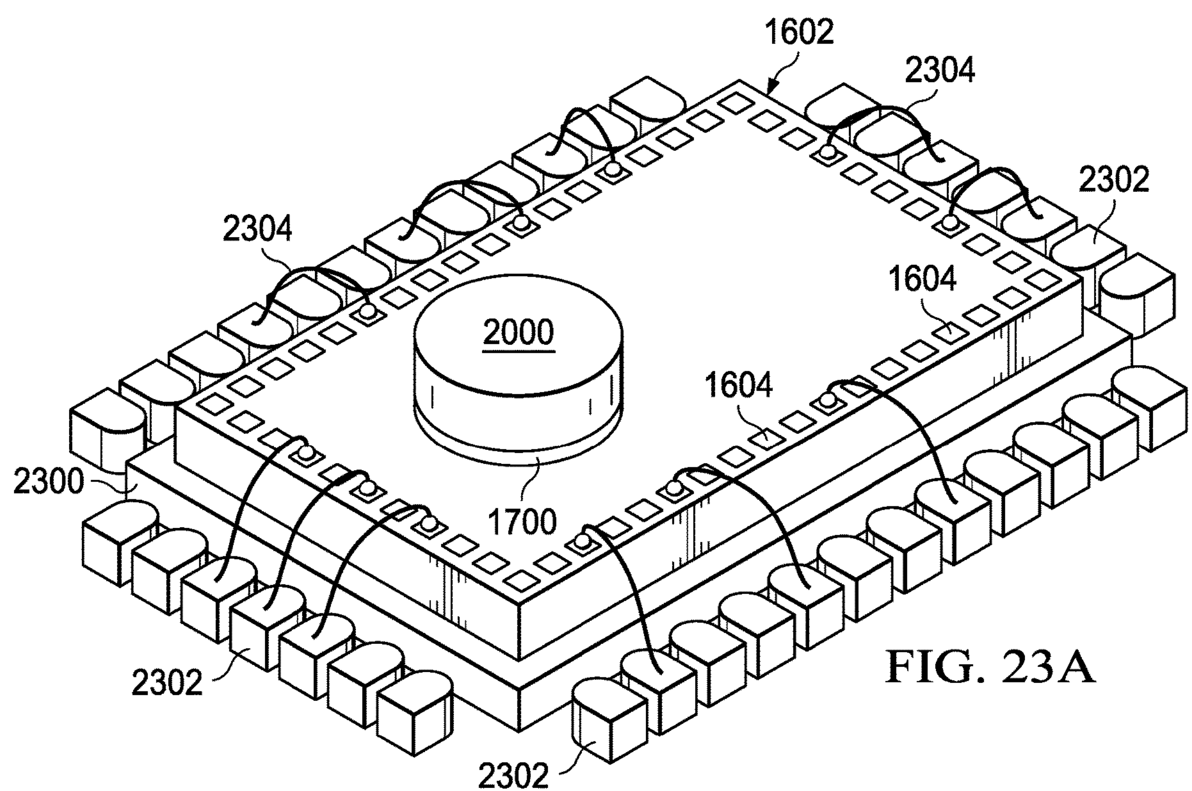
Figure 23B:
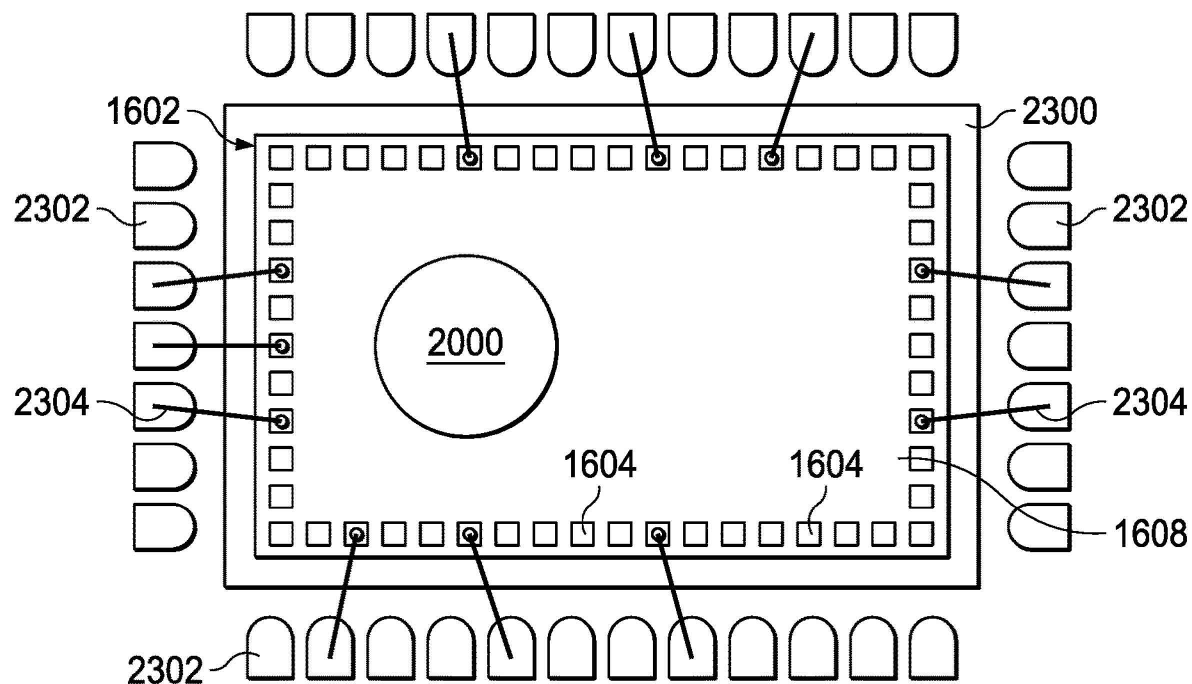
Figure 24:
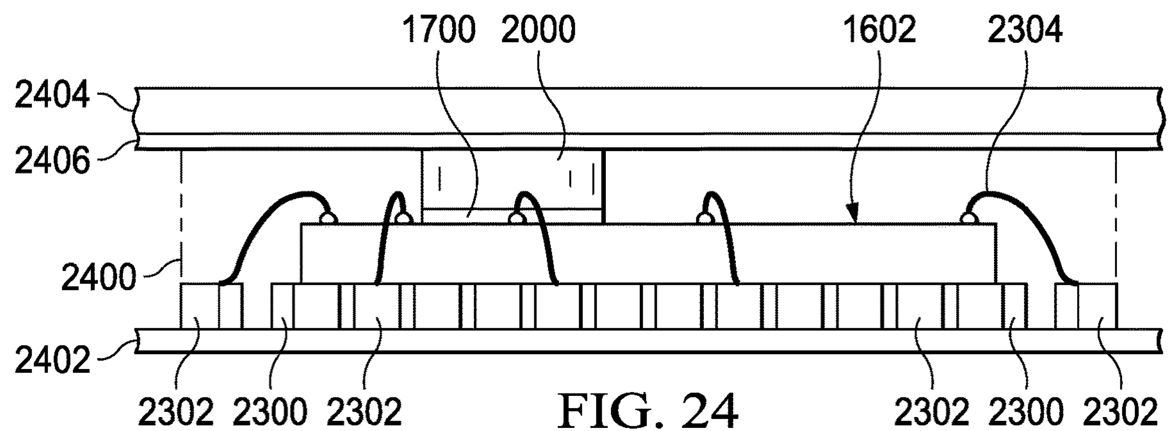
Figure 25A:
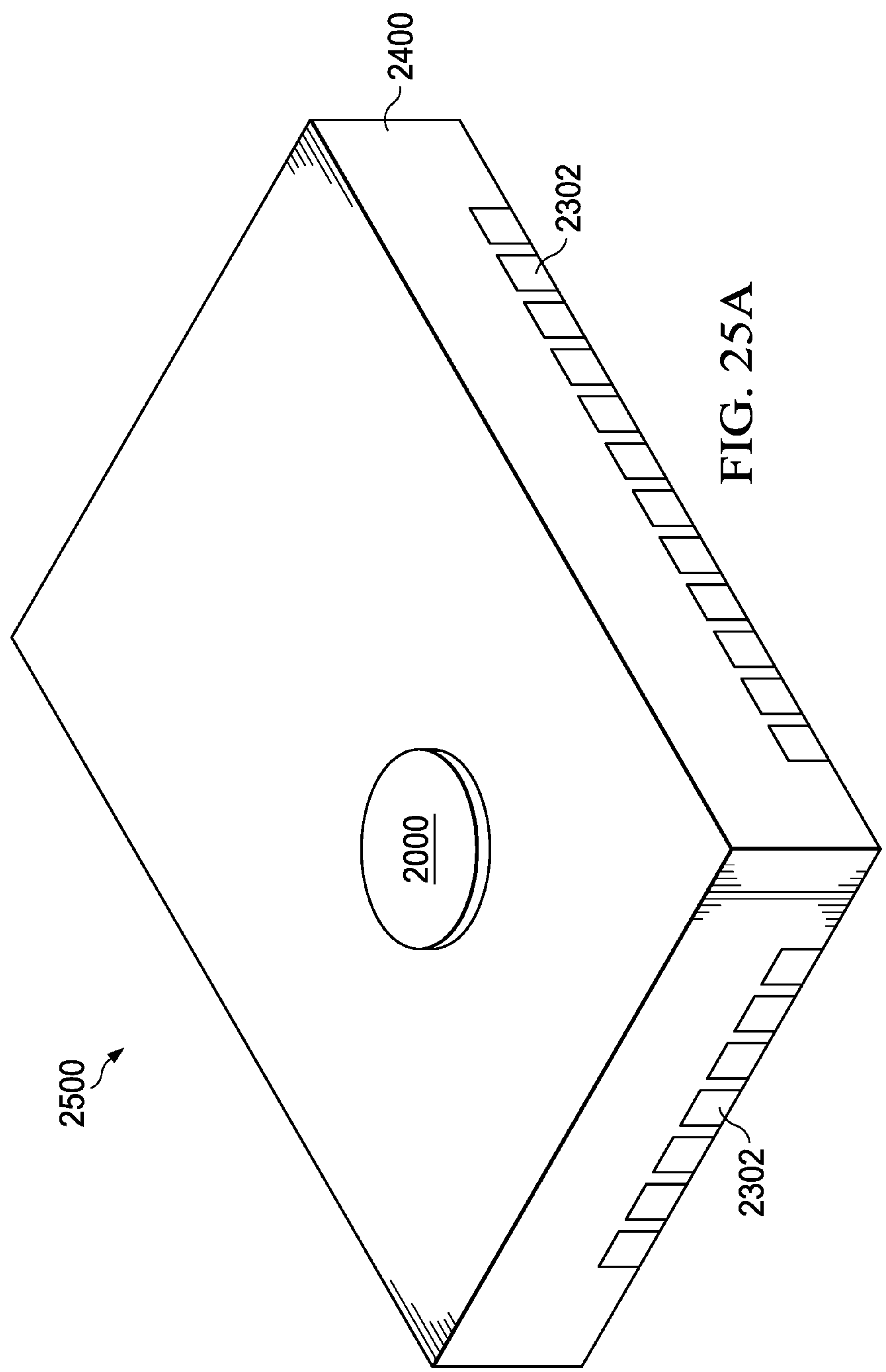
Figure 25B:
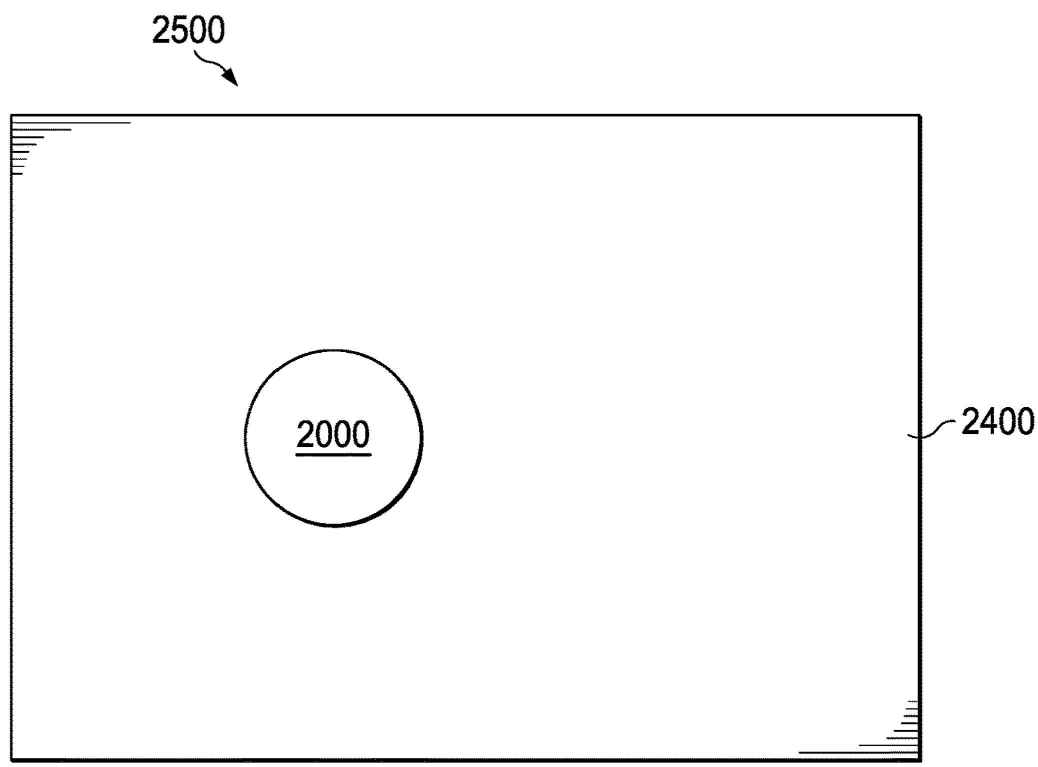
Figure 26B:
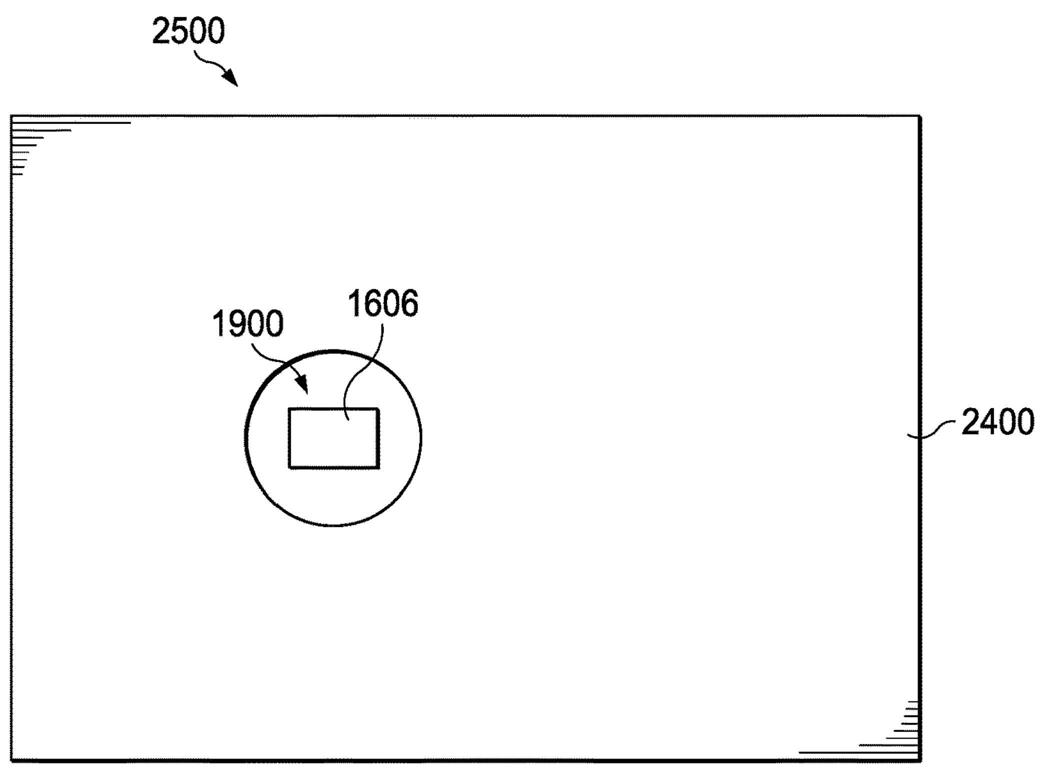
Figure 26A:
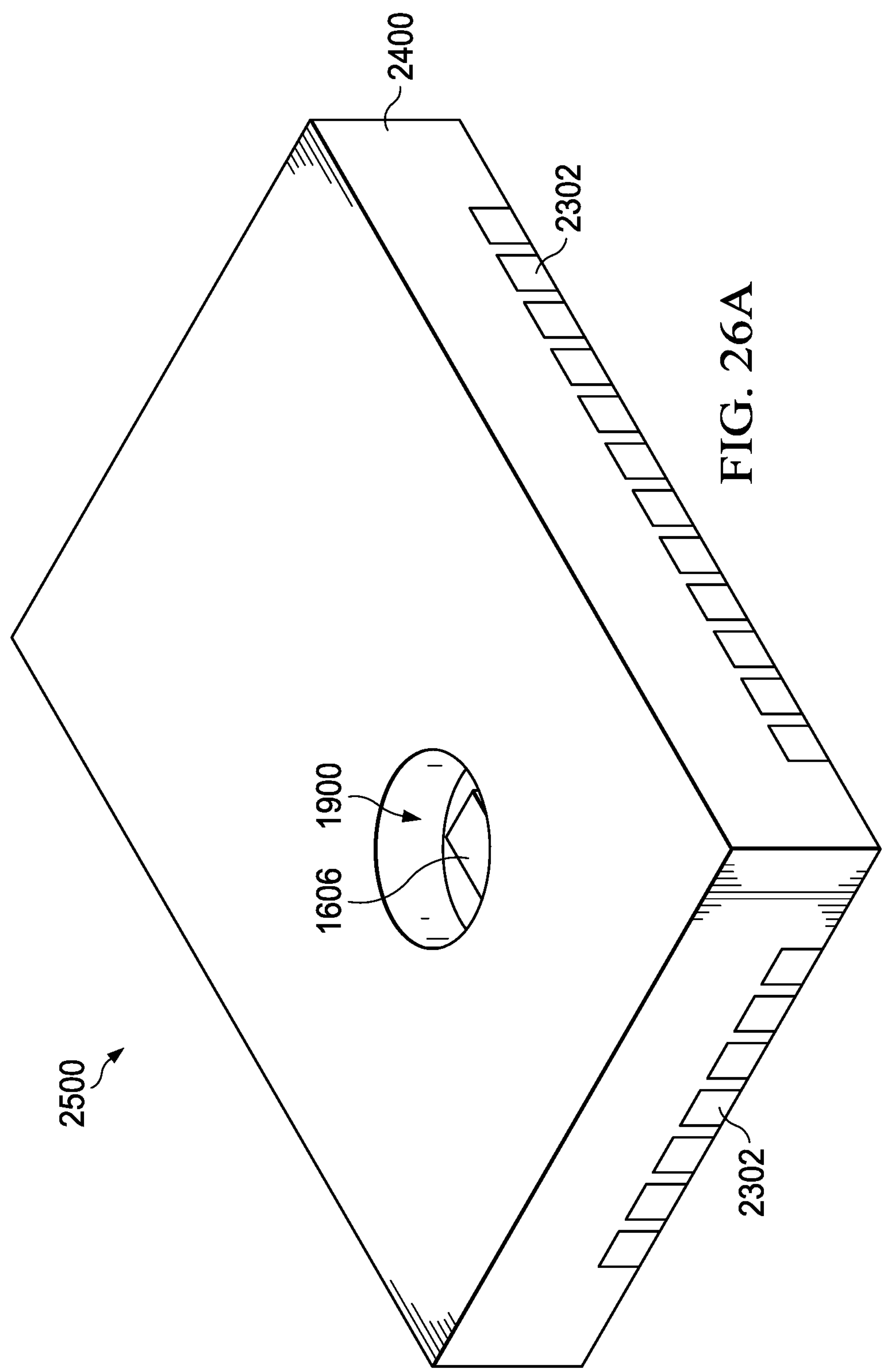

FIG. 23A is a perspective view of the structure of FIG. 22A, except with the semiconductor die 1602 mounted to a die pad 2300 of a lead frame in a lead frame strip, and the bond pads 1604 coupled to conductive terminals 2302 (e.g., leads) via bond wires 2304, as shown. FIG. 23B is a top-down view of the structure of FIG. 23A. FIG. 24 is a cross-sectional profile view of a mold chase having a top member 2404 and a bottom member 2402. The structure of FIG. 23A is positioned inside the mold chase between the top member 2404 and the bottom member 2402. A film 2406, having physical properties and a composition similar to the film 1004 described above, is positioned between the top member 2404 and the solid member 2000. For example, the film 2406 may be coupled to the bottom surface of the top member 2404. The film 2406 may mitigate a force transferred from the top member 2404 to the semiconductor die 1602 via the solid member 2000. In examples, the film 2406 may prevent a mold compound (e.g., mold compound 2400) from covering a top surface of the solid member 2000. FIG. 25A is a perspective view of the structure of FIG. 23A after the mold compound 2400 has been applied. As shown, the solid member 2000 is exposed and not covered by the mold compound 2400. The structure of FIG. 25A is considered to be a sensor package 2500, with the solid member 2000 exposed to an exterior surface of the mold compound 2400, as shown. FIG. 25B is a top-down view of the structure of FIG. 25A. The solid member 2000 may then be removed, for example by chemical etching, as FIG. 26A depicts. Removal of the solid member 2000 produces a sensor cavity 1900 in the mold compound 2400 through which the sensor 1606 is accessible and exposed to an exterior environment of the sensor package 2500. In this way, the solid member 2000 has prevented mold compound (e.g., mold compound 2400) from covering the sensor 1606. FIG. 26B is a top-down view of the structure of FIG. 26A.

Figure 27A:
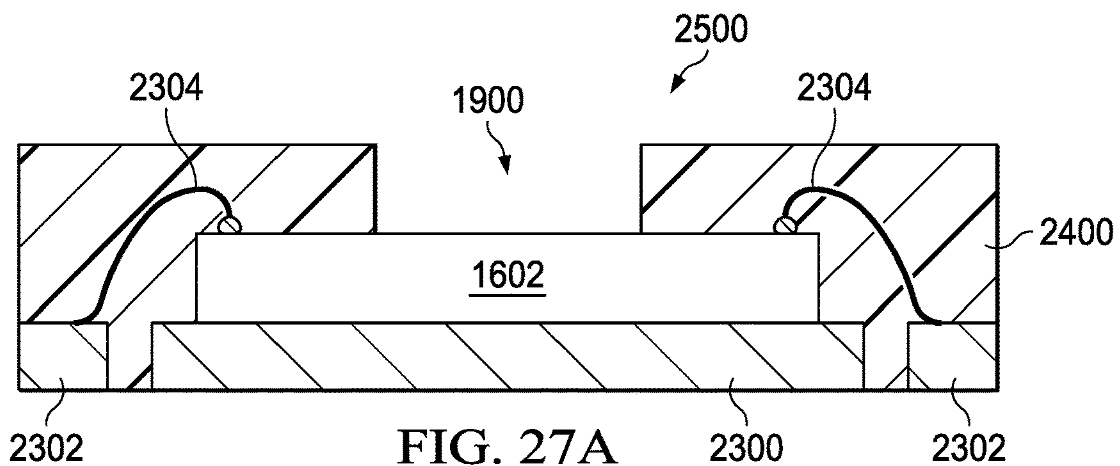
Figure 27B:
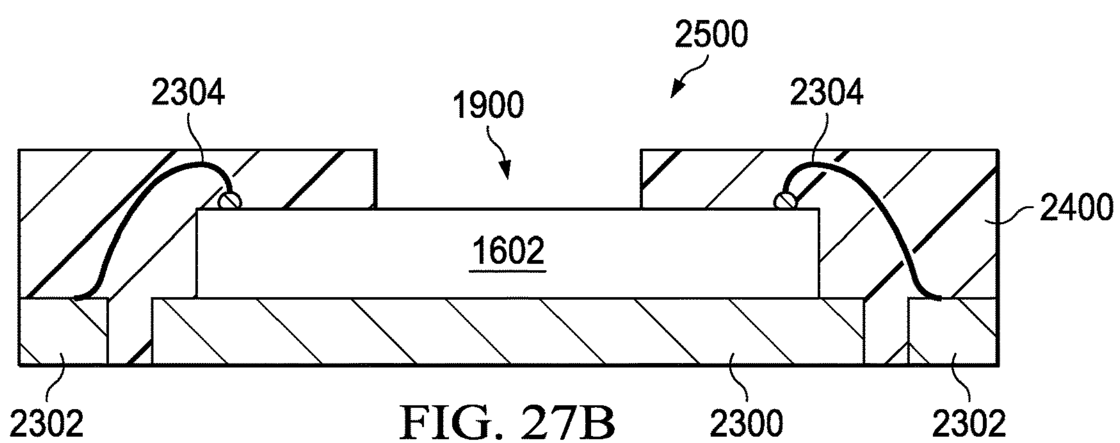
Figure 27C:
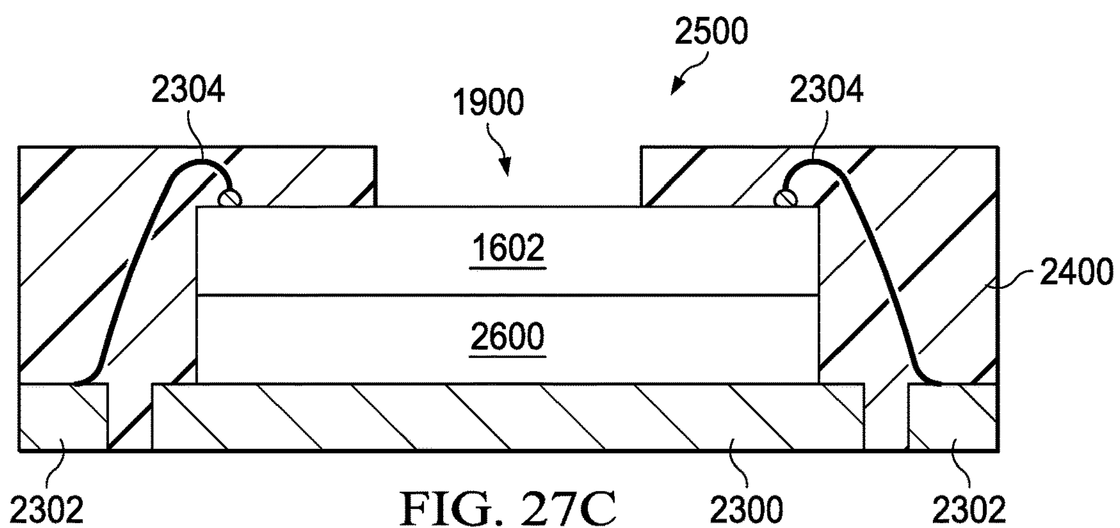

In some examples, the depth of the sensor cavity 1900 may be reduced using a variety of techniques. For instance, the size of the mold chase may be reduced, or a platform lacking electrical functionality may be used to raise the position of the semiconductor die (e.g., semiconductor die 1602) in such a way that reduces the depth of the sensor cavity 1900. FIG. 27A is a cross-sectional profile view of the sensor package 2500. The depth of the sensor cavity 1900 may be reduced as shown in FIG. 27B, in which the mold compound 2400 is applied using a smaller mold chase, thus reducing the overall thickness of the sensor package 2500. In this way, the depth of the sensor cavity 1900 is reduced. In FIG. 27C, a platform 2600 is provided to boost the height of the semiconductor die 1602, thus reducing the depth of the sensor cavity 1900. Other techniques also may be used to reduce the depth of the sensor cavity 1900 as desired.

Figure 28:
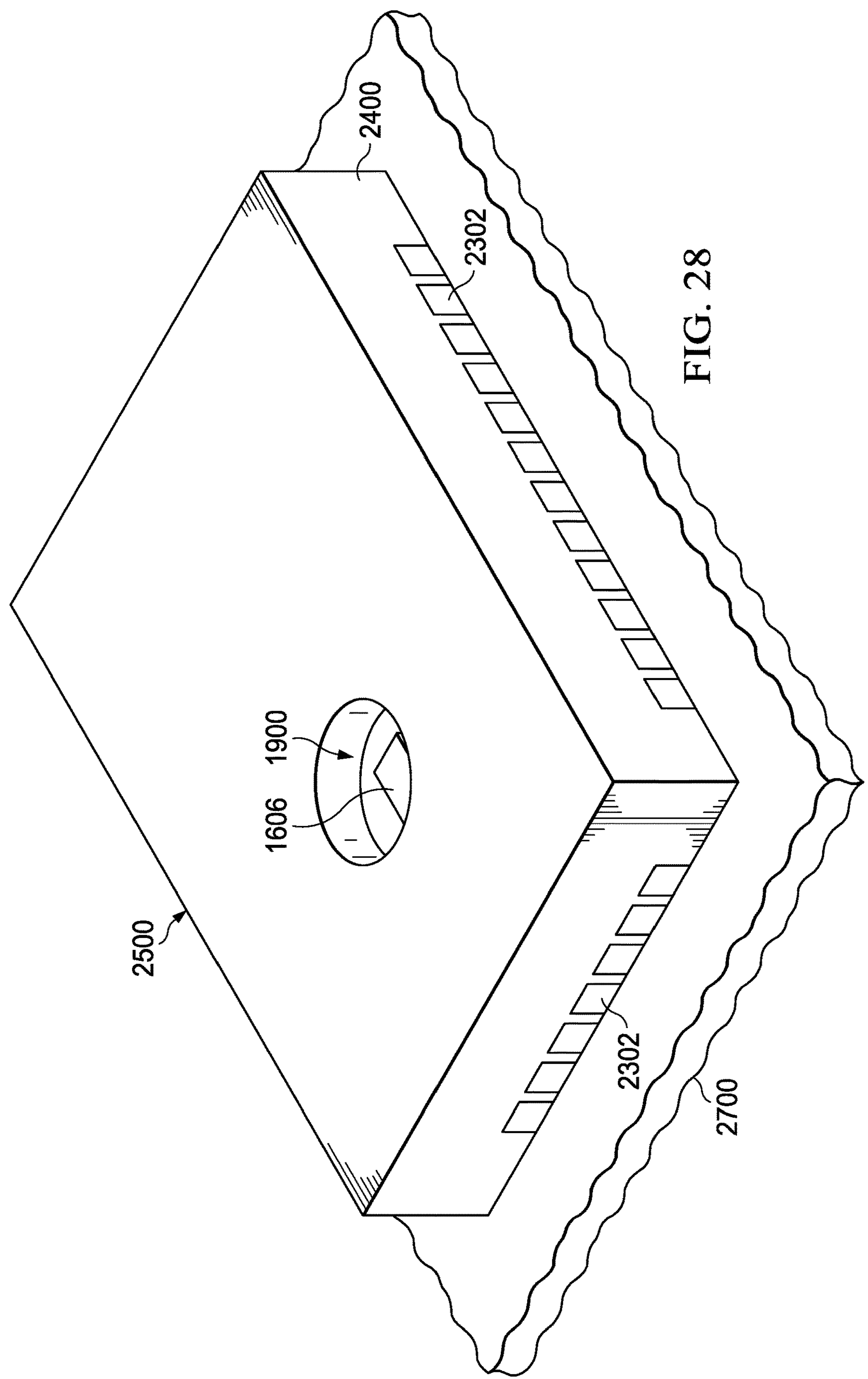

FIG. 28 is a perspective view of the sensor package 2500 mounted on a PCB 2700. Other circuitry also may be mounted on the PCB 2700, and the sensor package 2500 may couple to other such circuitry as desired. In operation, the sensor 1606 senses a physical property and provides a signal to a circuit (e.g., an AFE circuit) in the sensor package 2500 that is configured to process the signal from the sensor 1606. The circuit then outputs a signal to other circuitry either in the sensor package 2500 or on the PCB 2700 for further processing.

Because the sensor cavity 1900 is produced using highly precise photolithography and plating techniques, the sensor cavity 1900 may be substantially smaller in size than other, conventionally-produced sensor cavities. For example, no dimension of the sensor cavity 1900 in the horizontal plane (e.g., diameter, length, or width) exceeds 0.90 mm. Because the sensor cavity 1900 may be smaller in size than conventional sensor cavities, the sensor package 2500 may also be substantially smaller in size than conventional sensor packages. For the same reason, a sensor package 2500 may accommodate multiple sensor cavities (and sensors), while a conventional sensor package may only be able to accommodate a single sensor cavity (and sensor). Accordingly, the various advantages and benefits described above are realized by the sensor package 2500 and by other packages formed using the techniques described herein.

Figure 29A:
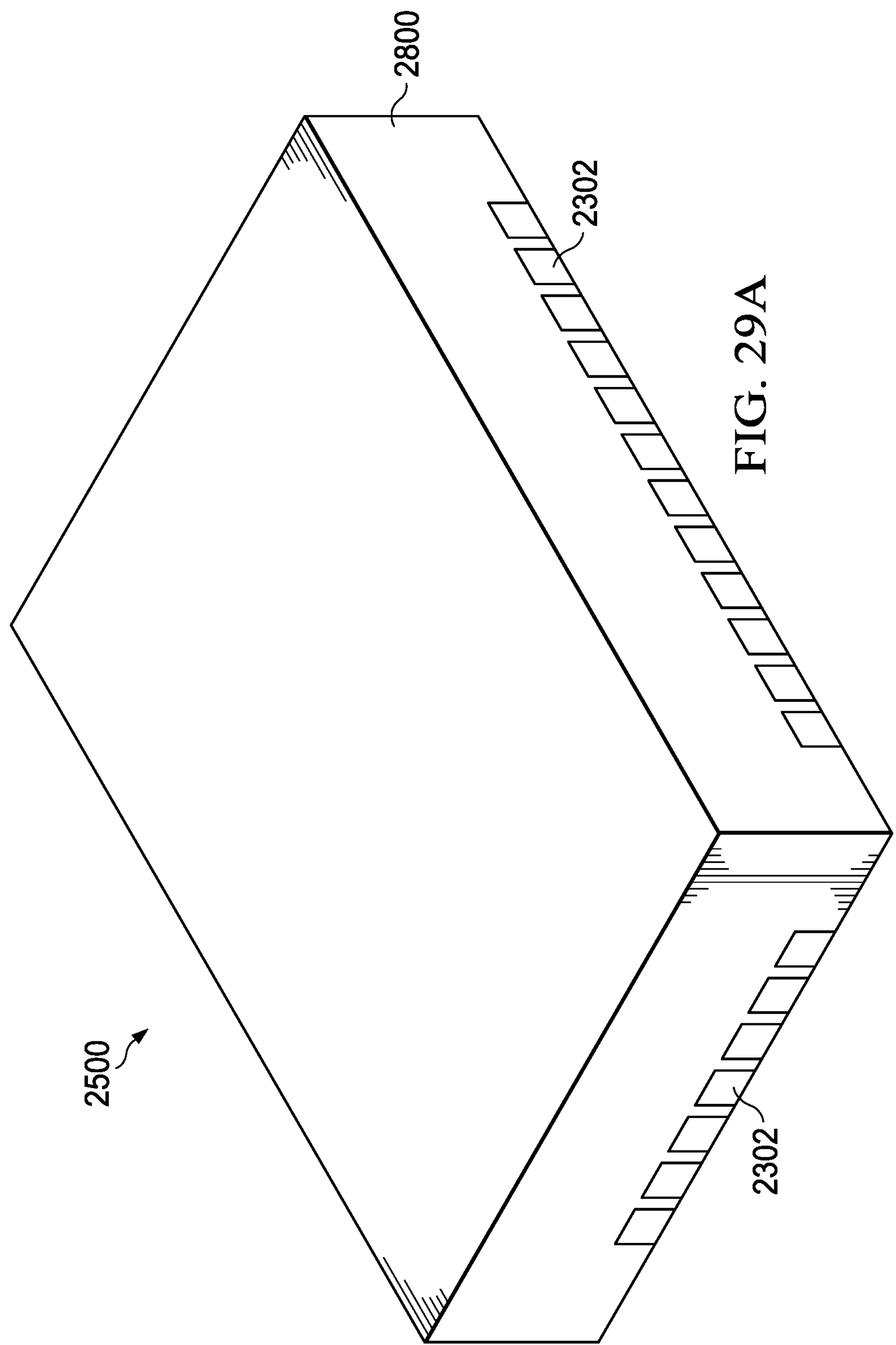
Figure 29B:
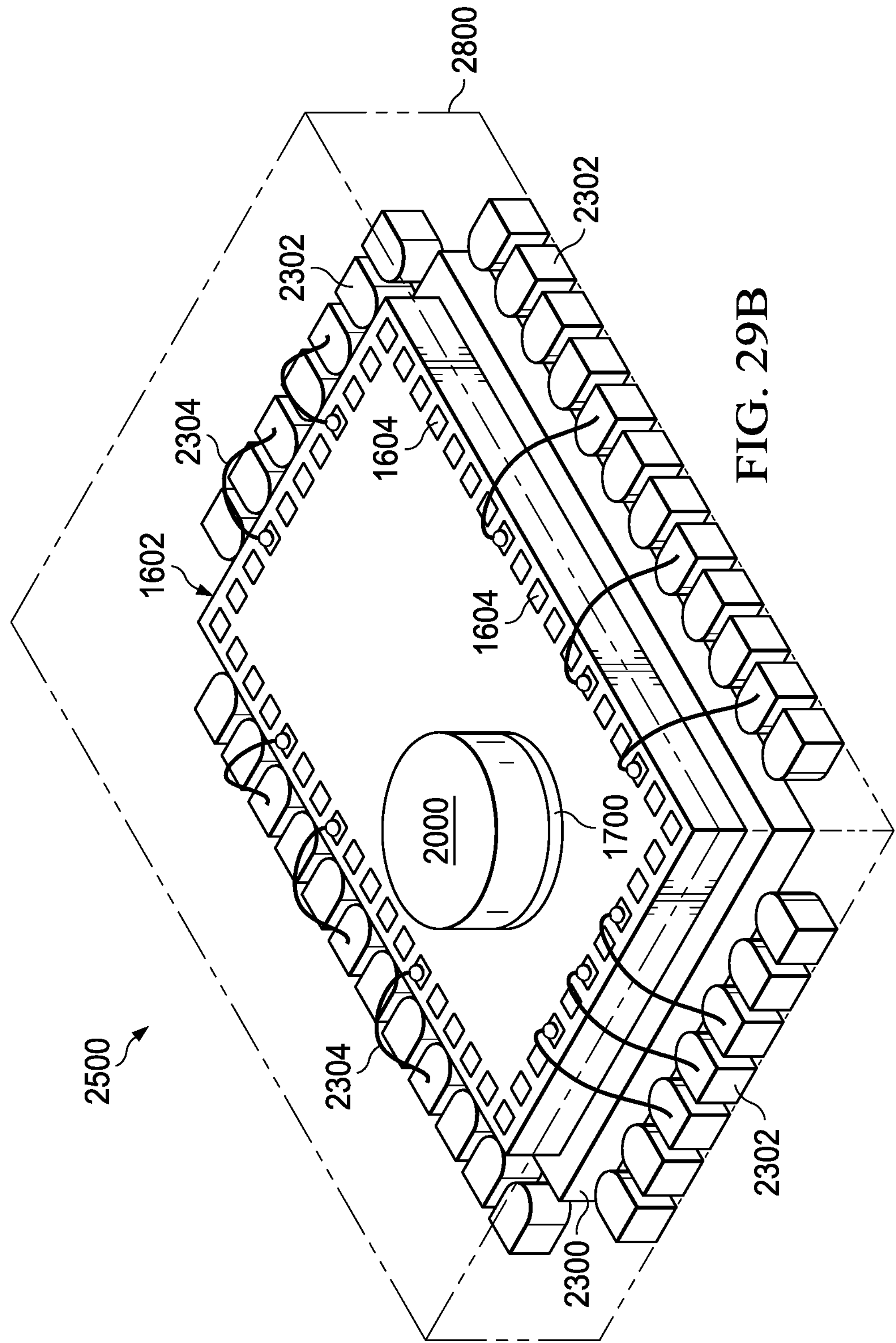
Figure 29C:
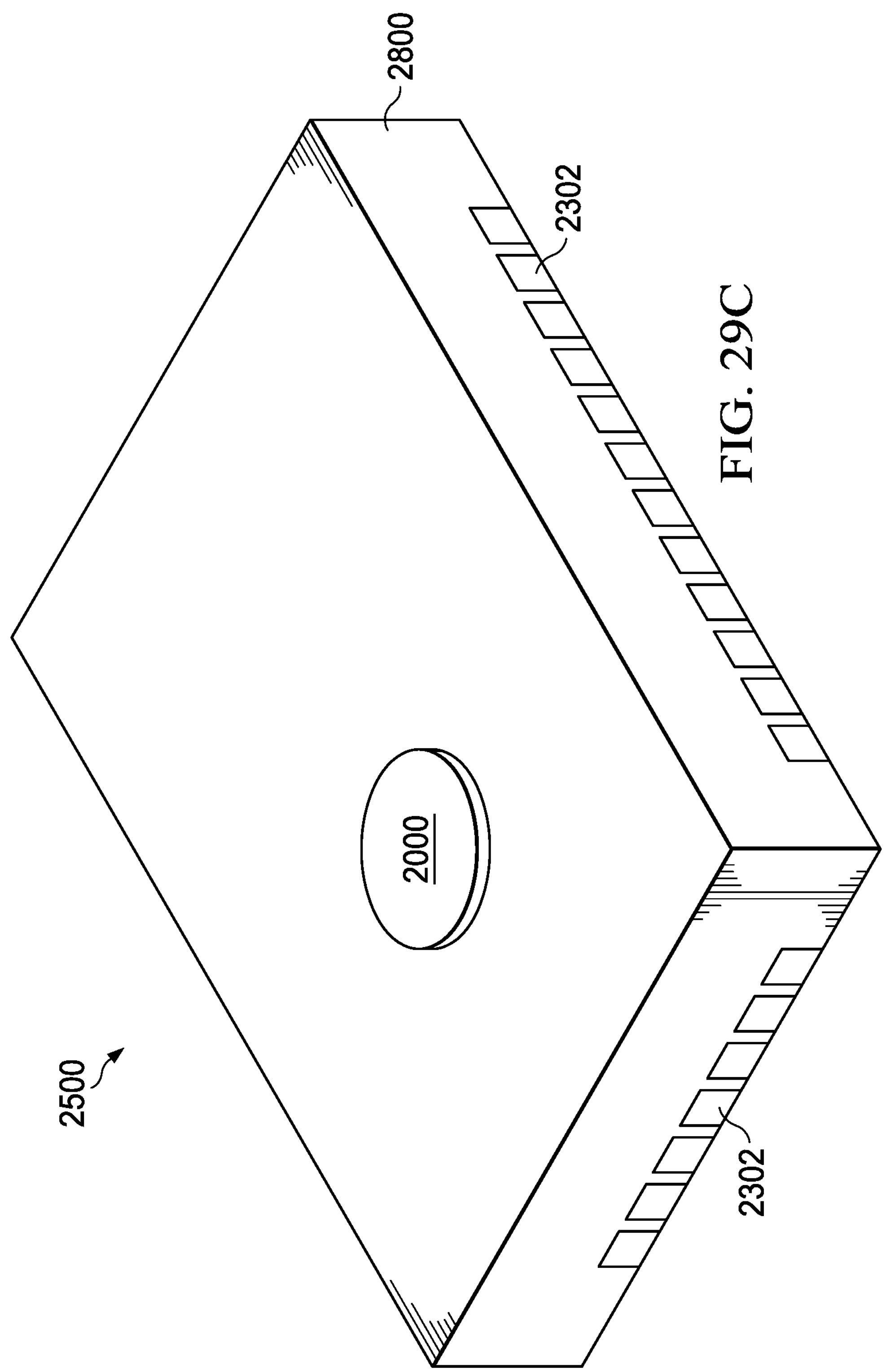
Figure 29D:
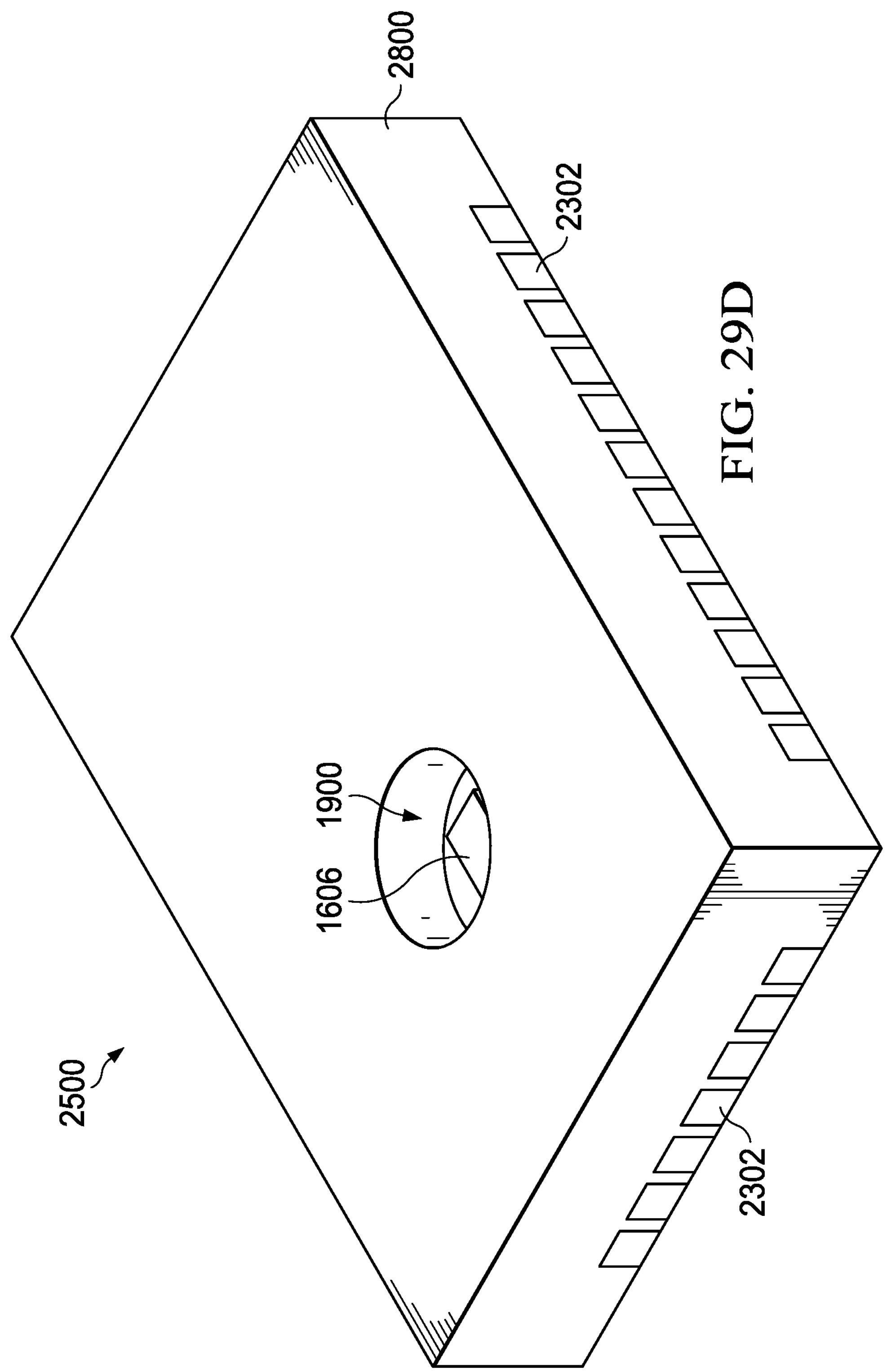

As explained above with respect to FIG. 24, in some examples, a film 2406 is used to mitigate the transfer of force from the top member 2404 of the mold chase to the semiconductor die 1602. In other examples, this transfer of force may be mitigated in other ways. For example, this transfer of force may be mitigated by introducing a gap between the top surface of the solid member 2000 and the bottom surface of the top member 2404. However, mold compound may flow through this gap, thereby forming the structure shown in FIG. 29A, in which a mold compound 2800 covers not only the semiconductor die 1602 but also the solid member 2000. FIG. 29B is a see-through version of FIG. 29A, in which the solid member 2000—which is fully covered by the mold compound 2800—is visible. In such examples, the solid member 2000 may be removed by first grinding the mold compound 2800 until the solid member 2000 is exposed, as FIG. 29C shows. After the solid member 2000 is exposed, it may be removed, for example using a chemical etching technique (e.g., using diluted nitric acid). FIG. 29D shows the solid member 2000 having been removed. In this way, a sensor cavity 1900 is formed in the mold compound 2800 such that the sensor 1606 is exposed to an exterior environment of the sensor package 2500.

Figure 30A:
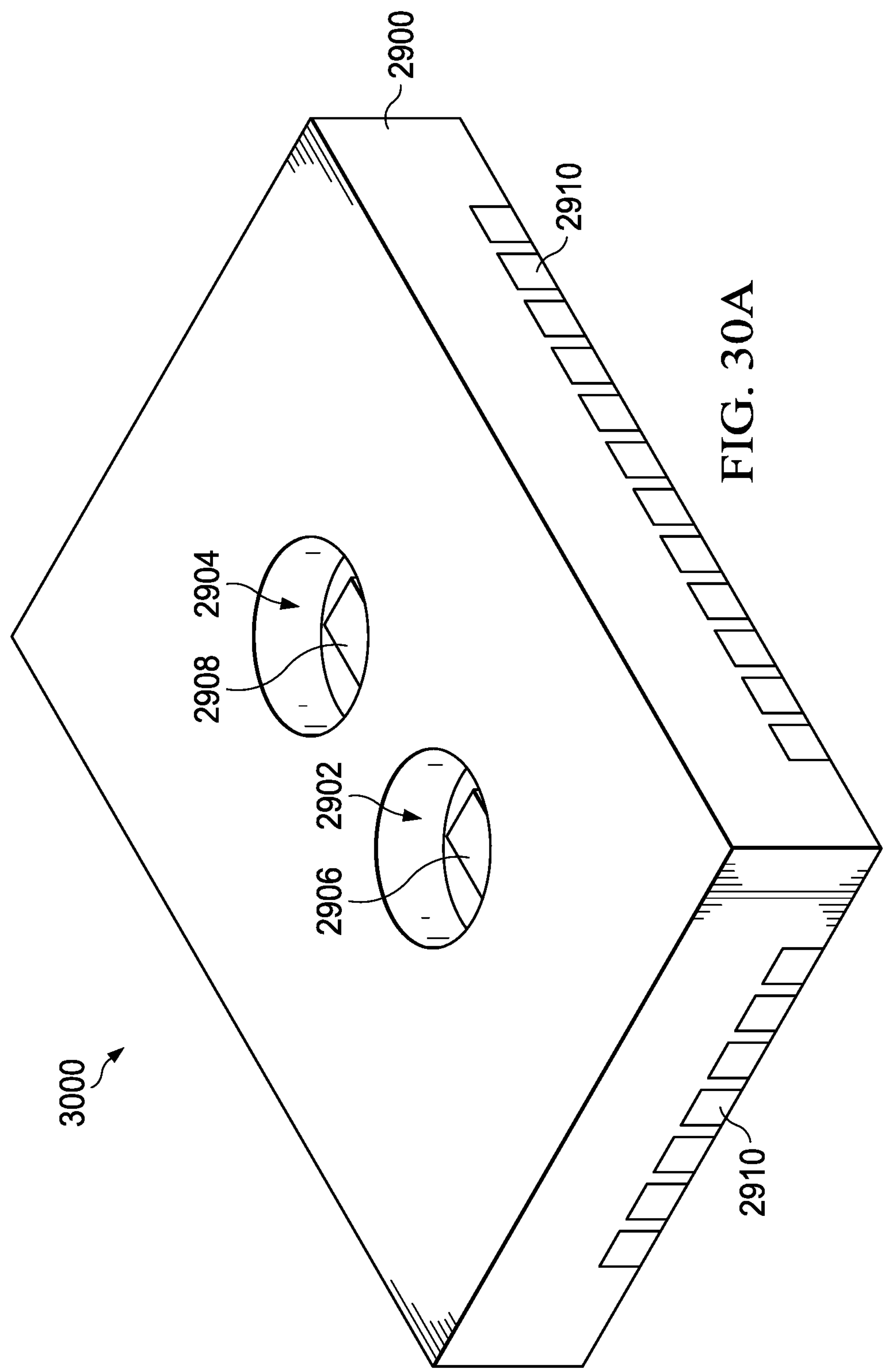
Figure 30B:
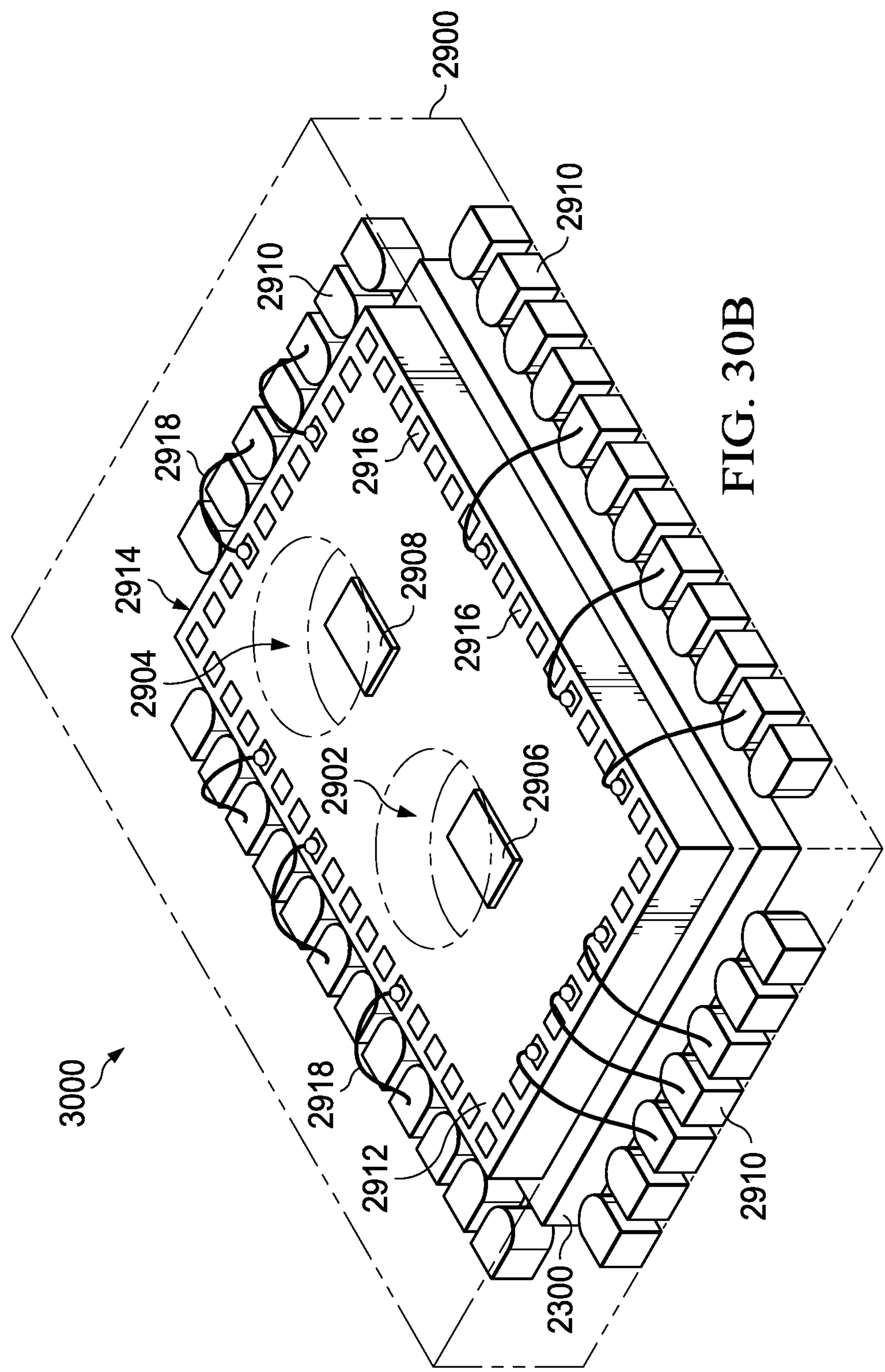
Figure 30C:
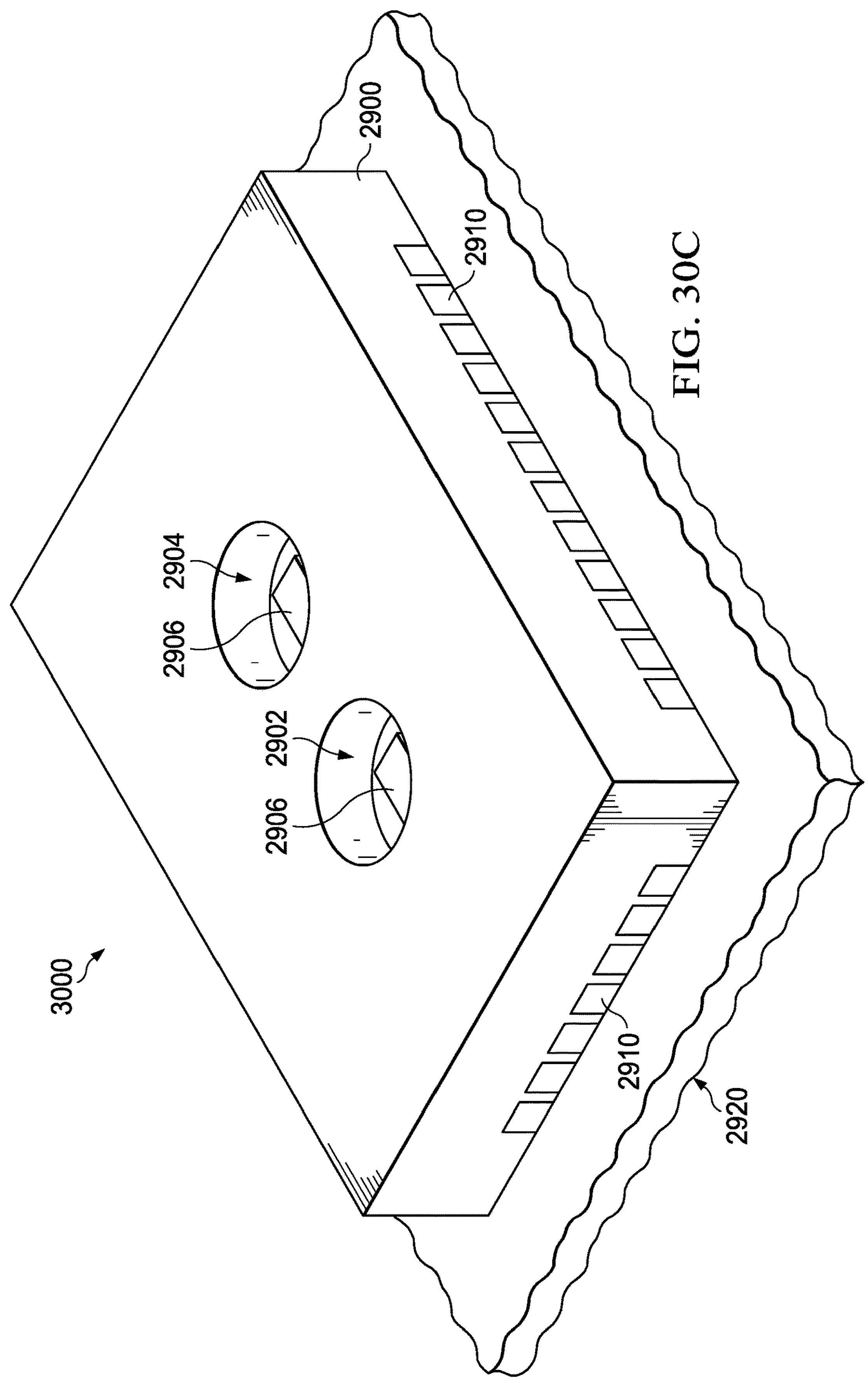
Figure 30D:
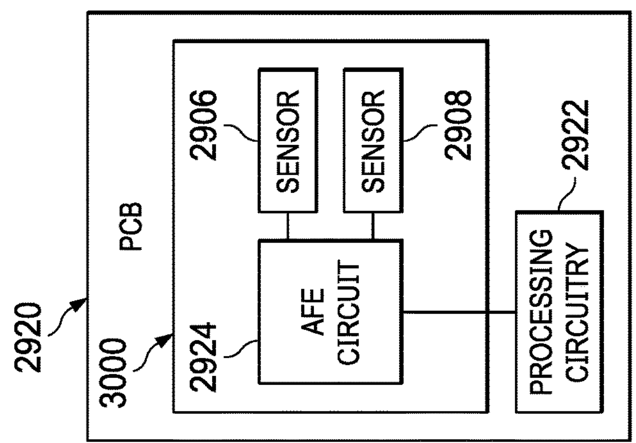

The foregoing examples describe sensor packages having one sensor cavity. However, as explained, the techniques described herein facilitate the formation of sensor cavities that are significantly smaller than conventional sensor cavities. Accordingly, multiple sensor cavities may be formed in a single sensor package. FIG. 30A is a perspective view of a sensor package 3000 having sensor cavities 2902, 2904 formed in a mold compound 2900. A sensor 2906 is inside the sensor cavity 2902, and a sensor 2908 is inside the sensor cavity 2904. FIG. 30B shows a see-through view of the sensor package 3000, with the sensors 2906, 2908 positioned on an active surface 2912 of a semiconductor die 2914. The sensors 2906, 2908 and other circuitry on the active surface 2912 couple to the conductive terminals 2910 via bond pads 2916 and bond wires 2918, as shown. Although two sensor cavities and sensors are shown in FIG. 30B, any number of sensor cavities (and sensors) may be included in the sensor package 3000. FIG. 30C shows the sensor package 3000 mounted on a PCB 2920, which may also have other circuitry mounted thereupon, such as processing circuitry that receives signals from the sensors 2906, 2908, an AFE circuit that processes signals from the sensors 2906, 2908, etc. and processes the signals as desired. FIG. 30D is a schematic block diagram of the structure of FIG. 30C. Specifically, FIG. 30D shows the PCB 2920 on which the sensor package 3000 and processing circuitry 2922 are mounted. The sensor package 3000 couples to the processing circuitry 2922. As explained above, the sensor package 3000 includes sensors 2906, 2908 and an AFE circuit 2924. The AFE circuit 2924 is configured to receive and process signals from the sensors 2906, 2908, and to output processed signals to the processing circuitry 2922. The processing circuitry 2922 is configured to receive signals from the AFE circuit 2924 and to further process the signals as desired. In examples, the AFE circuit 2924 services multiple sensors, such as the sensors 2906, 2908. In contrast, conventional sensor packages include a single sensor and a single AFE circuit. By using one AFE circuit 2924 to process signals received from multiple sensors (e.g., sensors 2906, 2908), the space, time, and expense associated with using multiple AFE circuits is mitigated.

Figure 31:
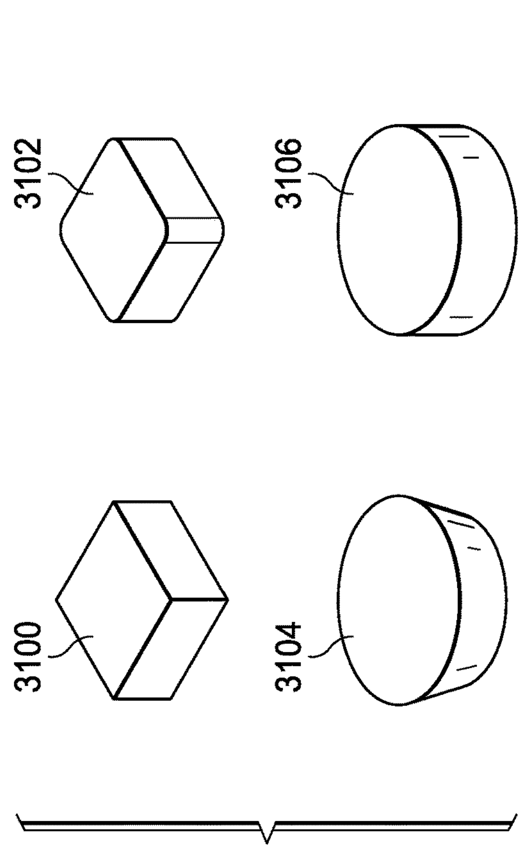

The above examples assume that the solid member 2000 is formed using a photolithography and plating process, which, as explained, is sufficiently precise so as to form relatively small solid members 2000. However, other techniques also may be used to form the solid member 2000. For example, the solid member 2000 may be formed separately from the semiconductor die and may subsequently be coupled to the semiconductor die using, e.g., adhesive. FIG. 31 depicts four example solid members that may be used in various examples. Each of the solid members depicted in FIG. 31 is representative of the solid member 2000. For instance, a solid member 3100 is rectangular and has right-angle corners, as shown. A solid member 3102 is rectangular and has rounded corners, as shown. A solid member 3104 is circular and has an outer surface that is slanted in such a way that facilitates removal after a mold compound has been applied. A solid member 3106 is also circular and has a vertical outer surface. The scope of this disclosure is not limited to the particular examples shown in FIG. 31. Various materials may be used to form the solid member 2000, such as the example solid members shown in FIG. 31. In examples, the solid member 2000 is metal (e.g., copper, nickel, aluminum, steel, metal alloy) and in other examples the solid member 2000 is non-metal (e.g., ceramic, plastic, fiber). In examples, the solid member 2000 may be coupled to the semiconductor die using an adhesive, solder, epoxy, etc. In examples, thermoplastic low-strength adhesives (e.g., in the range of 300 to 1000 g/sq. cm. peel strength) may be used to facilitate subsequent removal after the mold compound has been applied. In examples, the solid member 2000 is coupled to a semiconductor die (e.g., covering a sensor) at any suitable time prior to a mold compound being applied. For example, the solid member 2000 may be coupled to the semiconductor die before the semiconductor die is singulated from its wafer. In other examples, the solid member 2000 may be coupled to the semiconductor die post-singulation but prior to application of a mold compound. In examples, after the solid member 2000 has been coupled to a semiconductor die, the resulting structure may be placed inside a mold chase for application of a mold compound. In examples, a film (e.g., the film 2606 of FIG. 24) may be used to mitigate the transfer of force from a top member of the mold chase to the semiconductor die. In other examples, the film may be omitted and the resulting portion of mold compound on top of the solid member 2000 may be subjected to a grinding process so that the solid member 2000 may be exposed and removed, as described above.

Figure 32:
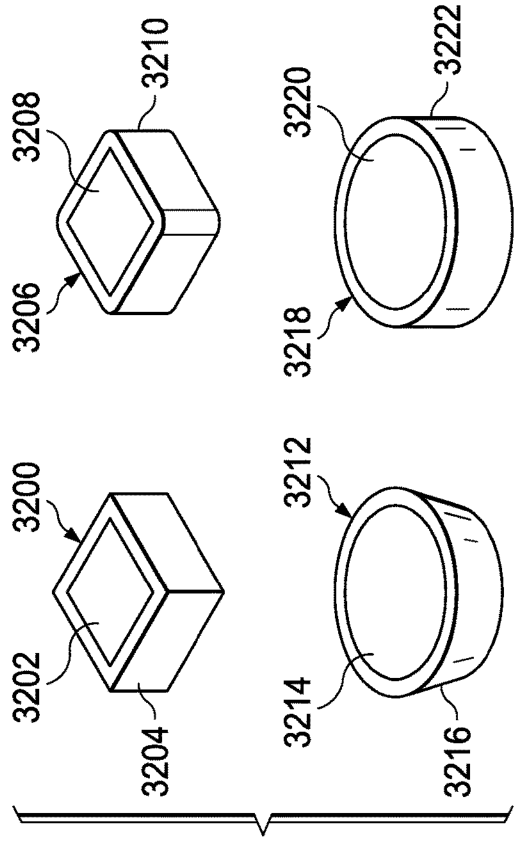

In some examples, the solid member 2000 may include multiple portions. For example, the solid member 2000 may include a core portion composed of a metal or non-metal material and an outer portion, such as a metal, coupled to an outer surface of the core portion. FIG. 32 shows four such example solid members, each of which is representative of the solid member 2000. For instance, an example solid member 3200 includes a rectangular core member 3202 having a metal plating 3204 coupled to an outer surface of the core member 3202. The solid member 3200 has right-angle corners, as shown. An example solid member 3206 includes a rectangular core member 3208 having a metal plating 3210 coupled to an outer surface of the core member 3208. The solid member 3206 has rounded corners, as shown. An example solid member 3212 includes a circular core member 3214 having a metal plating 3216 coupled to an outer surface of the core member 3214. In examples, the metal plating 3216 has a slanted outer surface, as shown, which facilitates removal after a mold compound has been applied. An example solid member 3218 includes a circular core member 3220 having a metal plating 3222 coupled to an outer surface of the core member 3220. In examples, the metal plating 3222 has a vertical outer surface, as shown. In examples, the core members are composed of a metal such as copper, nickel, aluminum, steel, or a metal alloy, or a non-metal such as ceramic, plastic, or fiber. In examples, any suitable plating metal may be used for the metal platings (e.g., metal platings 3204, 3210, 3216, 3222), such as titanium or titanium tungsten. Various other shapes, sizes, and materials are contemplated and included in the scope of this disclosure. The solid member 2000 (e.g., any of the solid members depicted in FIG. 32) may be coupled to a semiconductor die using any suitable adhesive, epoxy, solder, etc. In examples, a thermoplastic low-strength adhesive (e.g., ethyl cyanoacrylate, diluted epoxies, etc.) may be used to facilitate subsequent removal after a mold compound has been applied.

Figure 33A:
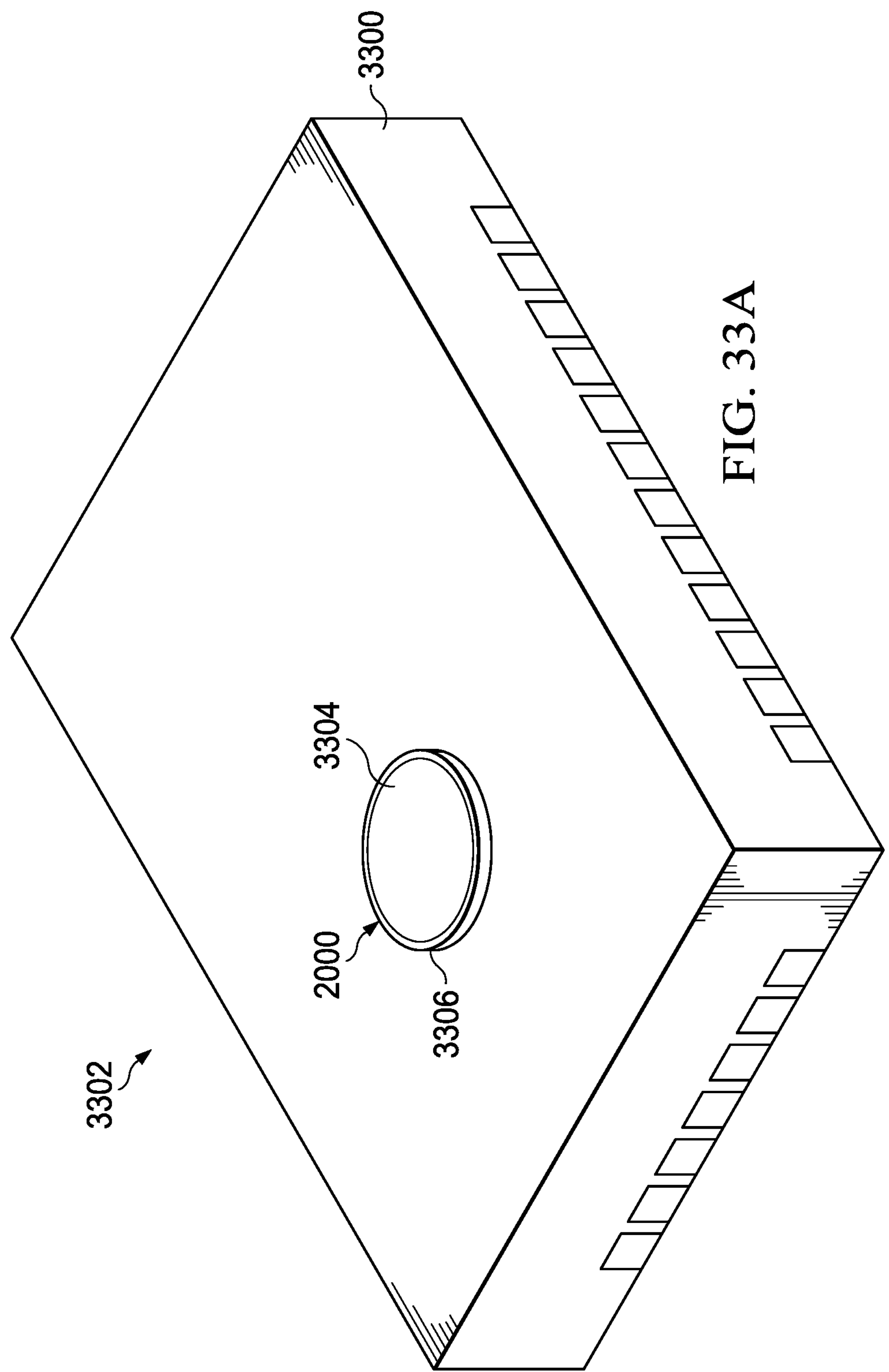
Figure 33B:
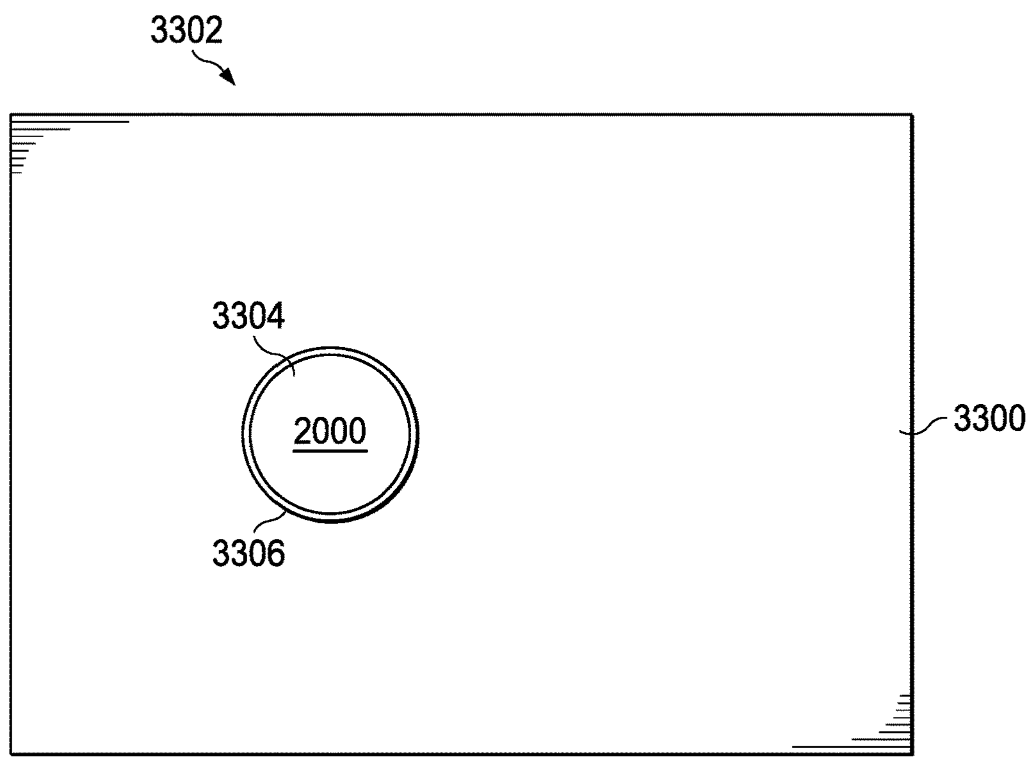
Figure 33C:
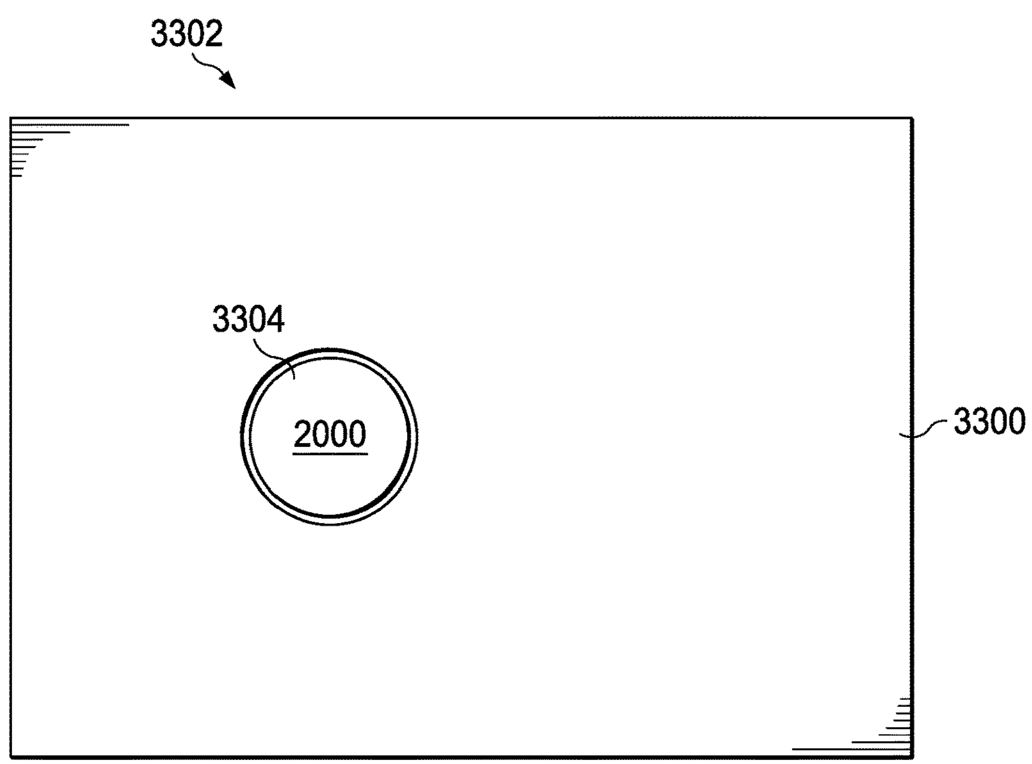
Figure 33D:
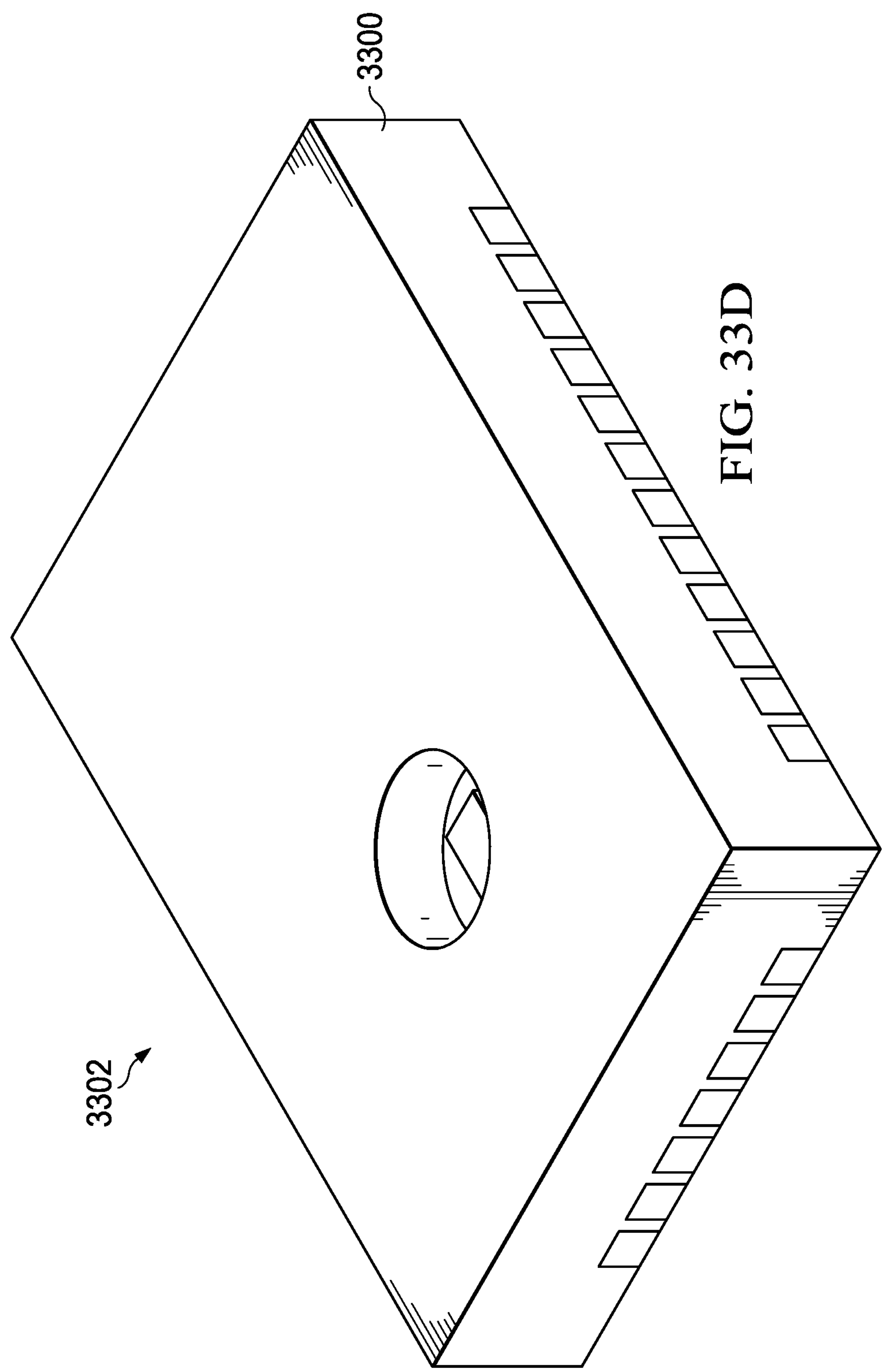

After the solid member 2000 has been coupled to a semiconductor die, a mold compound may be applied as described above (e.g., as depicted in FIGS. 23A-24). In examples, a film (e.g., film 2606 of FIG. 24) may be used during application of the mold compound, and in other examples, such a film may be omitted. If such a film is used, the solid member 2000 will not be covered by the mold compound. In such cases, the metal plating of the solid member 2000 (e.g., metal platings 3204, 3210, 3216, 3222 in FIG. 32) may be removed using a chemical etch, using heat (e.g., 260 degrees Celsius) to melt the metal plating, etc. After the metal plating has been removed, the core member (e.g., core members 3202, 3208, 3214, 3220 in FIG. 32) may be removed using gravity or by mechanically picking the core member out of the sensor cavity. The core member may be easily removed because, in at least some examples, it is coupled to the semiconductor die using a low-strength adhesive, as described above. FIG. 33A is a perspective view of a solid member 2000 abutting a mold compound 3300 in a sensor package 3302, and FIG. 33B is a top-down view of the structure of FIG. 33A. The solid member 2000 incudes a core member 3304 and a metal plating 3306, as described above. After application of an appropriate chemical etch, heat, etc. to remove the metal plating 3306, the core member 3304 remains, as FIG. 33C shows. The core member 3304 is subsequently removed, leaving the completed sensor package 3302 as FIG. 33D depicts.

Figure 34A:
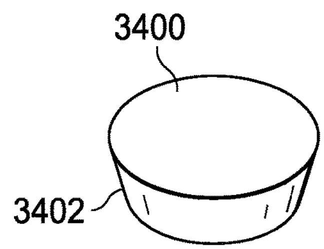
Figure 34B:
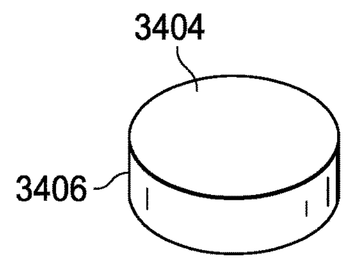
Figure 34E:
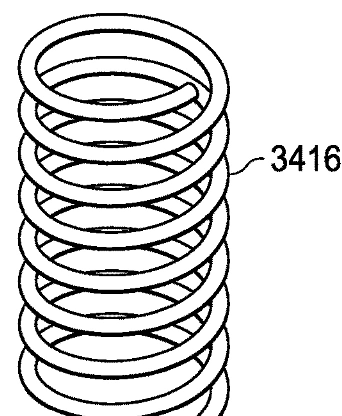
Figure 34C:
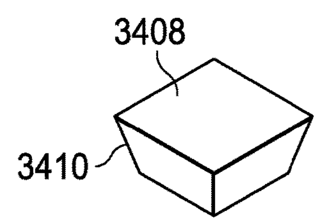
Figure 34D:
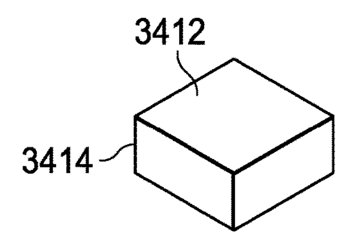

Still other types of solid members 2000 are contemplated and included in the scope of this disclosure. In some examples, a solid member 2000 may be composed of a compressible material, such as polyimide, silicon gel foam, a spring, rubber, ceramic, plastic, fiber, etc. In examples, the compressible solid member 2000 has a compressibility that ranges from 20% to 50% of the uncompressed thickness of the solid member 2000 (e.g., if the solid member 2000 has an uncompressed thickness of 100 microns, it could be compressed by 20 microns to 50 microns, for a compressed thickness ranging from 50 microns to 80 microns). In examples, the solid member 2000 has a compressibility that ranges from 50% to 80% of the uncompressed thickness of the solid member 2000. The lower end of this compressibility range is determined to maintain an approximately uniform thickness and smooth surface, while the upper end of this compressibility range is determined to provide a tight seal during molding and to compensate for non-coplanarities and non-uniform surfaces in the structures adjacent to the solid member 2000. The compressible solid member 2000 will be compressed (e.g., reduce in thickness) as the mold chase is closed. However, a film, such as film 1004 or 2606 described above, may be omitted because the compressible solid member 2000 will maintain contact with the bottom surface of the top member of the mold chase as the mold chase is closed and after the mold chase is closed. In examples, the relationship between the thickness and the compressibility of the solid member 2000 is such that when the mold chase is closed, the solid member 2000 forms a seal with the bottom surface of the top member of the mold chase. For example, a thicker solid member 2000 may be used if the solid member 2000 has a greater compressibility, or a thinner solid member 2000 may be used if the solid member 2000 has a lower compressibility. In examples, the compressible solid member 2000 has a slanted outer surface that facilitates removal from the mold compound after the mold compound has been applied. Such a compressible solid member 2000 may be coupled to a semiconductor die, and specifically to a sensor of the semiconductor die, to protect the sensor from being covered by mold compound. In examples, the compressible solid member 2000 is coupled to the sensor of the semiconductor die using an adhesive, solder, epoxy, or any other suitable material. FIG. 34A depicts a perspective view of an example compressible solid member 3400 having a circular cross-section and a slanted outer surface 3402; FIG. 34B depicts a perspective view of an example compressible solid member 3404 having a circular cross-section and a non-slanted, vertical outer surface 3406; FIG. 34C depicts a perspective view of an example compressible solid member 3408 having a rectangular cross-section and a slanted outer surface 3410; FIG. 34D depicts a perspective view of an example compressible solid member 3412 having a rectangular cross-section and a non-slanted, vertical outer surface 3414; and FIG. 34E depicts a profile view of a compressible solid member 3416, which may be a spring. The various structures of FIGS. 34A-34E are examples of compressible solid members 2000. The spring compressible solid member 3416 of FIG. 34E may be used if it is fully compressed so that no mold compound is able to flow through the solid member 3416 and onto the sensor on which the solid member 3416 is mounted. After the mold compound has been applied, the compressible solid member 2000 may be chemically removed (e.g., using a suitable etchant) or mechanically removed (e.g., using a pick). The adhesive used to couple the compressible solid member 2000 to the sensor of the semiconductor die may be removed (e.g., dissolved) using a suitable solvent, such as hydrochloric acid, sulfuric acid, isopropyl alcohol, toluene, xylene, etc. In the event that solder was used to couple the compressible solid member 2000 to the sensor of the semiconductor die, the solder may be reflowed and removed. In the event that an epoxy was used to couple the compressible solid member 2000 to the sensor of the semiconductor die, the epoxy may be removed using a suitable solvent, such as hydrochloric acid, sulfuric acid, isopropyl alcohol, toluene, xylene, etc.

Figure 35:
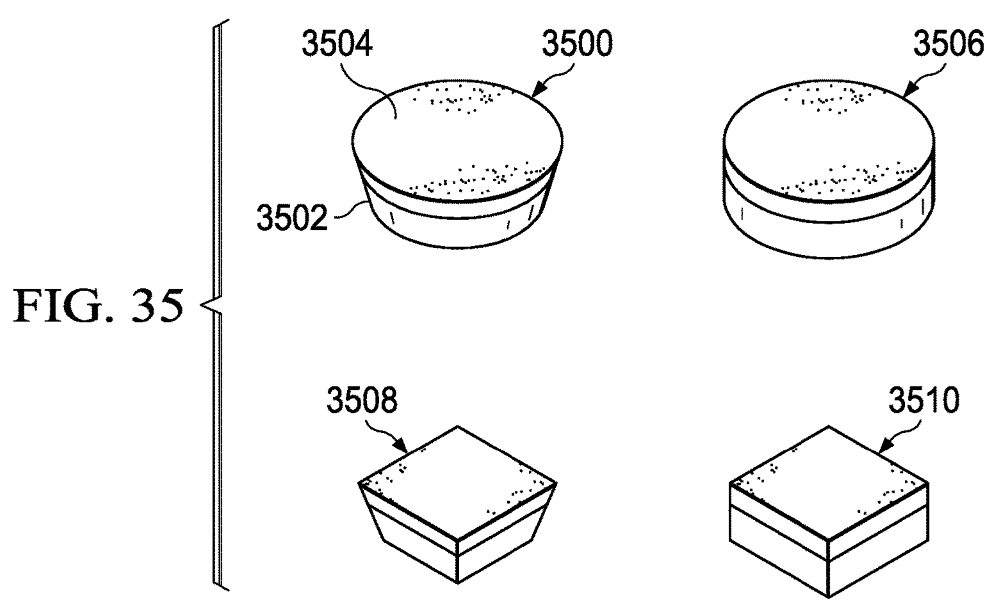

In some examples, a solid member 2000 includes both a non-compressible component (e.g., metal) and a compressible component. FIG. 35 depicts a perspective view of an example solid member 3500 having a non-compressible component 3502 and a compressible component 3504 positioned on the non-compressible component 3502. The non-compressible component 3502 may have any of the physical properties of the structures depicted in, e.g., FIG. 31, and the description of the structures of FIG. 31 apply to the non-compressible component 3502. The compressible component 3504 may have any of the physical properties of the structures depicted in, e.g., FIGS. 34A-34D, and the description of the structures of FIGS. 34A-34D apply to the compressible component 3504. The thicknesses of the non-compressible component 3502 and the compressible component 3504 may vary, so long as the total thickness of the solid member 3500 is such that the mold chase used to apply mold compound closes fully and such that the top surface of the compressible component 3504 makes contact with the bottom surface of the top member of the mold chase so that mold compound cannot enter a space therebetween. For a given thickness of the solid member 3500, a relatively thicker non-compressible component 3502 results in a relatively thinner compressible component 3504, and a relatively thinner non-compressible component 3502 results in a relatively thicker compressible component 3504. A solid member 3500 having a thinner compressible component 3504 and a thicker non-compressible component 3502 may be advantageous when a deeper cavity is being used, and a solid member 3500 having a thicker compressible component 3504 and a thinner non-compressible component 3502 may be advantageous when a shallower cavity is being used. In examples, the compressible component 3504 constitutes at least 75% of the thickness of the solid member 3500, and in other examples, the non-compressible component 3502 constitutes at least 75% of the thickness of the solid member 3500. A thicker compressible component 3504 relative to the non-compressible component 3502 may be beneficial to better tolerate process variations, while a thicker non-compressible component 3502 relative to the compressible component 3504 may beneficial to produce consistency in cavity shapes and sizes. The non-compressible component 3502 may be coupled to a sensor of a semiconductor die using a thermoplastic low-strength adhesive (e.g., in the range of 300 to 1000 g/sq. cm. peel strength). As explained above, one benefit to using such an adhesive is that the solid member 3500 may be easily removed (e.g., using a pick) after a mold compound is applied. In examples, the compressible component 3504 couples to the non-compressible component 3502 using ethyl cyanoacrylate, diluted epoxies, etc., although other materials also may be used. The example solid member 3500 may be useful at least because the compressible component 3504 obviates the use of a film (e.g., film 1004 or 2606, described above) for the reasons described above with respect to the compressible solid members shown in FIGS. 34A-34E, and because the non-compressible component 3502 facilitates the use of a thermoplastic low-strength adhesive (e.g., in the range of 300 to 1000 g/sq. cm. peel strength) for easy subsequent removal after a mold compound is applied. In examples, after application of the mold compound, a suitable chemical(s) (e.g., using a suitable etchant) may be used to remove both the compressible component 3504 and the non-compressible component 3502. One or both of the compressible and non-compressible component may be removed mechanically (e.g., using a pick). An adhesive or other material used to couple the non-compressible component 3502 to the sensor of the semiconductor die may be removed (e.g., dissolved) using, e.g., a solvent or other suitable material. As shown in FIG. 35, the outer surface of the solid member 3500 may be slanted. Alternatively, as solid member 3506 shows, the outer surface may be non-slanted (vertical). The solid members 3500 and 3506 have circular cross-sections. However, in examples, solid members 3508, 3510 may have rectangular cross-sections, with the solid member 3508 including a slanted outer surface and the solid member 3510 including a non-slanted (vertical) outer surface. The solid members 3500, 3506, 3508, and 3510 are examples of a solid member 2000.

In examples, the solid member 2000 may have physical properties similar to those provided above for the example structures of FIG. 31, except that the solid member 2000 may be composed of material with a high coefficient of thermal expansion (CTE), such as plasticized polyvinyl chloride (PVC), polytetrafluorotheylene (PTFE), polyvinylidene fluoride (PVDF), aluminum, etc. In examples, the high-CTE solid member 2000 has a CTE ranging from 40 PPM to 200 PPM. In examples, the high-CTE solid member 2000 is cut or punched from a foil, although any and all techniques for forming such solid members 2000 are contemplated. In examples, the outer surfaces of the high-CTE solid members 2000 are slanted for easy removal after mold compound has been applied, and in other examples, the outer surfaces of the high-CTE solid members 2000 are non-slanted (vertical). In examples, the high-CTE solid member 2000 is coupled to a sensor of a semiconductor die using a suitable adhesive, solder, epoxy, thermoplastic low-strength adhesive (e.g., in the range of 300 to 1000 g/sq. cm. peel strength, etc.). In examples, after the high-CTE solid member 2000 is coupled to the sensor, a mold compound is applied at high temperature (e.g., 150-200 degrees Celsius). A film, such as film 1004 or 2606, may be positioned between the top surface of the high-CTE solid member 2000 and a bottom surface of a top member of the mold chase used to apply the mold compound, for example as shown in FIGS. 10 and 24. After the mold compound has been applied, the high-CTE solid member 2000 is frozen (e.g., at 0 degrees Celsius or lower, depending on the composition of the high-CTE solid member 2000), thus reducing the size of the high-CTE solid member 2000. The high-CTE solid member 2000 may then be easily removed using either gravity or a mechanical pick tool. An insufficiently high CTE for the solid member 2000 will result in the high-CTE solid member 2000 being stuck in the mold compound or being difficult to remove from the mold compound. Conversely, an excessively high CTE for the solid member 2000 may result in excessive expansion during the aforementioned high-temperature mold compound application, resulting in a cavity in the mold compound after removal of the high-CTE solid member 2000 that may be unacceptably large. The adhesive or other material used to couple the high-CTE solid member 2000 to the sensor may be removed (e.g., dissolved) using a suitable solvent or any other suitable agent.

Figure 36:
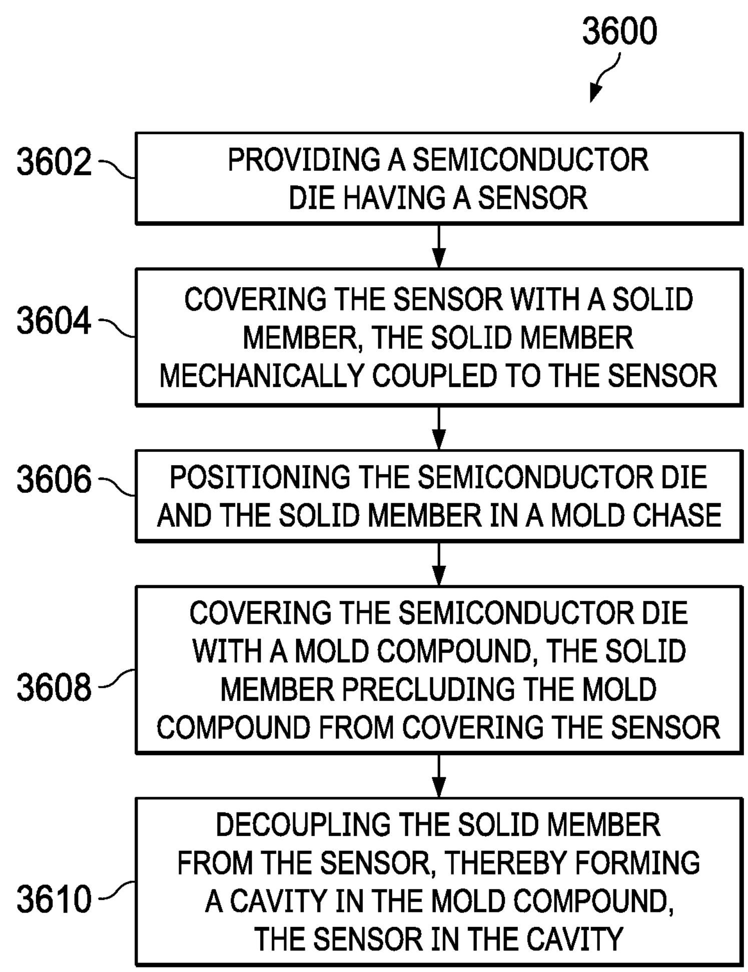
FIG. 36 is a flow diagram of a method for manufacturing a sensor package having a miniature sensor cavity, in accordance with various examples.

FIG. 36 is a flow diagram of a method 3600 that summarizes the techniques and process flows described above with respect to FIGS. 16A-35. The method 3600 begins with providing a semiconductor die having a sensor (3602). The method 3600 includes covering the sensor with a solid member, with the solid member mechanically coupled to the sensor (3604). The method 3600 includes positioning the semiconductor die and the solid member in a mold chase (3606). The method 3600 includes covering the semiconductor die with a mold compound, with the solid member precluding the mold compound from covering the sensor (3608). The method 3600 includes decoupling the solid member from the sensor, thereby forming a cavity in the mold compound (3610). The sensor is in the cavity (3610). At least some of the various examples of the solid members (e.g., solid members 2000) described above may be re-used in a second application after removal from a first application.

Unless otherwise stated, "about," "approximately," or "substantially" preceding a value means+/−10 percent of the stated value. The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A sensor package, comprising:
- a semiconductor die;
- a sensor on the semiconductor die;
- a ring on the semiconductor die encircling the sensor, the sensor and an inner surface of the ring exposed to an exterior environment of the sensor package; and
- a mold compound covering the semiconductor die and abutting an outer surface of the ring.

2. The sensor package of claim 1, wherein a greatest distance between an inner diameter of the ring and the sensor is 5 microns.

3. The sensor package of claim 1, wherein an inner diameter of the ring is less than 100 microns.

4. The sensor package of claim 1, further comprising a plating seed layer positioned between the ring and the semiconductor die.

5. The sensor package of claim 1, wherein the ring is a metal ring.

6. The sensor package of claim 1, wherein the ring includes a stairstep pattern.

7. The sensor package of claim 1, wherein the outer surface of the ring is slanted.

8. The sensor package of claim 1, wherein the ring has a shape in a horizontal plane, the shape selected from the group consisting of: circular, ovoid, and rectangular.

9. A sensor package, comprising:
- a semiconductor die;
- a sensor on the semiconductor die; and
- a mold compound covering the semiconductor die and having a cavity positioned over the sensor such that the sensor is exposed to an exterior environment of the sensor package, wherein a diameter, length, or width of the cavity is less than 100 microns.

10. The sensor package of claim 9, further comprising:
- a second sensor on the semiconductor die, the mold compound having a second cavity positioned over the second sensor such that the second sensor is exposed to the exterior environment of the sensor package; and
- a circuit to process a signal received from the sensor and a second signal received from the second sensor, the circuit formed on the semiconductor die.

11. The sensor package of claim 1, wherein the ring includes one of copper, nickel, and aluminum.

12. The sensor package of claim 1, wherein the sensor package is a quad flat no leads (QFN) package.

13. The sensor package of claim 1, wherein the semiconductor die is electrically connected to leads of the QFN package via wire bonds.

14. The sensor package of claim 1, wherein a top surface of the ring is above a plane along a top surface of the mold compound in a view of the sensor package.

15. The sensor package of claim 1, wherein the sensor is configured to measure one of humidity, light, sound, pressure, bulk acoustic waves, stress, temperature, current, voltage, power, motion, acceleration, and magnetic fields.

16. A sensor package, comprising:
- a semiconductor die;
- a sensor on the semiconductor die;
- a ring on the semiconductor die encircling the sensor, the sensor and an inner surface of the ring exposed to an exterior environment of the sensor package; and
- a mold compound covering the semiconductor die and abutting an outer surface of the ring, wherein a top surface of the ring is above a top surface of the mold compound in one view of the sensor package.

* * * * *